(12) United States Patent
Kunze et al.

(10) Patent No.: US 9,380,708 B2
(45) Date of Patent: Jun. 28, 2016

(54) METHOD, HOLDING MEANS, APPARATUS AND SYSTEM FOR TRANSPORTING A FLAT MATERIAL TO BE TREATED AND LOADING OR UNLOADING APPARATUS

(75) Inventors: Henry Kunze, Wendelstein (DE); Christian Thomas, Erlangen (DE)

(73) Assignee: Atotech Deutschland GmbH, Berlin (DE)

( * ) Notice: Subject to any disclaimer, the term of this patent is extended or adjusted under 35 U.S.C. 154(b) by 1283 days.

(21) Appl. No.: 13/265,770

(22) PCT Filed: Apr. 22, 2010

(86) PCT No.: PCT/EP2010/002481
§ 371 (c)(1),
(2), (4) Date: Jan. 4, 2012

(87) PCT Pub. No.: WO2010/121815
PCT Pub. Date: Oct. 28, 2010

(65) Prior Publication Data
US 2012/0107074 A1 May 3, 2012

(30) Foreign Application Priority Data
Apr. 22, 2009 (DE) .......................... 10 2009 018 393

(51) Int. Cl.
*H05K 3/00* (2006.01)
*C23C 16/54* (2006.01)
(Continued)

(52) U.S. Cl.
CPC ............ *H05K 3/0085* (2013.01); *C23C 14/568* (2013.01); *C23C 16/4401* (2013.01);
(Continued)

(58) Field of Classification Search
CPC .. C23C 16/54; C23C 16/4412; C23C 14/568; C23C 16/4401; H01L 21/67017
USPC .............. 118/719; 156/345.2, 345.31, 345.32
See application file for complete search history.

(56) References Cited

U.S. PATENT DOCUMENTS 3,550,535 A * 12/1970 Rooklyn ................ B65G 17/20
 104/118
4,015,558 A * 4/1977 Small .................... C23C 14/568
 118/620

(Continued)

FOREIGN PATENT DOCUMENTS

CN 1249898 A 4/2000
CN 1427902 7/2003
(Continued)

*Primary Examiner* — Rudy Zervigon
(74) *Attorney, Agent, or Firm* — Mintz Levin Cohn Ferris Glovsky and Popeo, P.C.; Peter F. Corless; Steven M. Jensen

(57) ABSTRACT

In order to transport a flat material to be treated (21) in an installation for the chemical and/or electrochemical treatment of said material, within which the material to be treated (21) is transported within a plane of transport in a direction of transport (5), holding means (22, 25) are attached to said material to be treated (21). The holding means (22, 25) hold the material to be treated (21) at at least two points on an edge region of said material, which edge region is directed along the direction of transport (5) when said material to be treated (21) is being transported. The holding means (22, 25) are coupled in a detachable manner to a transporting device (41) which moves said holding means (22, 25) in the direction of transport in order to transport the material to be treated (21). At least during a portion of the transportation of the material to be treated (21), a force (6, 7) having a component which lies within the plane of transport and is directed transversely to the direction of transport (5), is exerted upon a region of the material to be treated (21), for example upon the longitudinal edge regions.

11 Claims, 11 Drawing Sheets

(51) Int. Cl.
 *C23C 16/44*  (2006.01)
 *H01L 21/67*  (2006.01)
 *C23C 14/56*  (2006.01)
 *C25D 17/06*  (2006.01)
 *H05K 13/00*  (2006.01)
 *H05K 1/03*  (2006.01)
 *H05K 3/06*  (2006.01)
 *H05K 3/24*  (2006.01)

(52) U.S. Cl.
 CPC ............ *C23C16/4412* (2013.01); *C23C 16/54* (2013.01); *C25D 17/06* (2013.01); *H01L 21/67017* (2013.01); *H05K 13/0061* (2013.01); *H05K 1/0393* (2013.01); *H05K 3/068* (2013.01); *H05K 3/243* (2013.01); *H05K 2203/0165* (2013.01); *H05K 2203/0271* (2013.01); *H05K 2203/1509* (2013.01); *H05K 2203/1545* (2013.01)

(56) References Cited

U.S. PATENT DOCUMENTS

| | | | |
|---|---|---|---|
| 4,260,869 A * | 4/1981 | Slavens | B23K 37/0217 104/119 |
| 4,358,472 A * | 11/1982 | Small | C23C 14/568 427/10 |
| 5,927,504 A | 7/1999 | Han et al. | |
| 6,112,885 A | 9/2000 | Kuster et al. | |
| 6,655,566 B1 * | 12/2003 | Martin | B26D 7/1827 225/101 |
| 6,849,134 B2 * | 2/2005 | Henley | F27B 9/10 118/718 |
| 6,902,053 B1 * | 6/2005 | Long | B65G 15/60 198/837 |
| 2003/0121790 A1 | 7/2003 | Hubel | |
| 2005/0115060 A1 * | 6/2005 | Kondo | H05K 13/0061 29/650 |
| 2005/0211534 A1 * | 9/2005 | Tefend | B65G 13/11 198/860.2 |
| 2005/0256774 A1 * | 11/2005 | Clothier | B65G 54/02 705/15 |
| 2006/0076241 A1 | 4/2006 | Schneider et al. | |
| 2006/0154386 A1 | 7/2006 | Cheng et al. | |
| 2006/0236935 A1 * | 10/2006 | Krause | C23C 14/564 118/724 |
| 2007/0214625 A1 * | 9/2007 | Brown | B68G 7/05 29/91.1 |
| 2009/0178900 A1 | 7/2009 | Scheller et al. | |
| 2010/0126415 A1 * | 5/2010 | Ishino | C23C 14/50 118/500 |
| 2011/0269256 A1 * | 11/2011 | Black | C23C 14/24 438/61 |
| 2011/0303510 A1 * | 12/2011 | Horn | B65G 47/261 198/606 |
| 2012/0214658 A1 * | 8/2012 | Chuba | B65B 43/123 493/405 |

FOREIGN PATENT DOCUMENTS

| | | |
|---|---|---|
| CN | 1688753 A | 10/2005 |
| DE | 42 43 252 A1 | 7/1993 |
| DE | 43 23 698 A1 | 1/1995 |
| DE | 43 39 092 A1 | 5/1995 |
| DE | 36 45 319 C2 | 3/1996 |
| DE | 691 18 301 T2 | 10/1996 |
| DE | 203 04 601 U1 | 6/2003 |
| DE | 102 41 619 A1 | 3/2004 |
| DE | 10 2005 024102 A1 | 11/2006 |
| DE | 10 2007 038 116 A1 | 2/2009 |
| JP | 2-103014 | 8/1990 |
| JP | 5-46948 | 6/1993 |
| JP | 2005-344164 A | 12/2005 |
| JP | 2005-537392 A | 12/2005 |
| JP | 2006143462 A * | 6/2006 |
| JP | 2007-177270 A | 7/2007 |
| JP | 2008545883 A | 12/2008 |
| KR | 20060081356 A | 7/2006 |

* cited by examiner

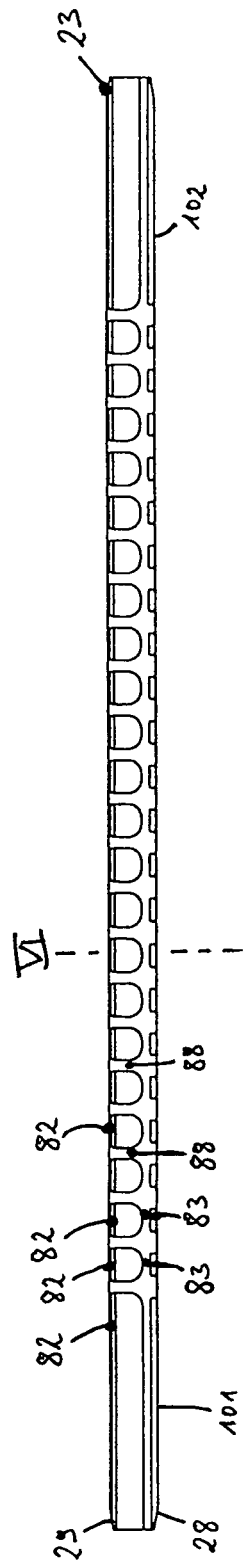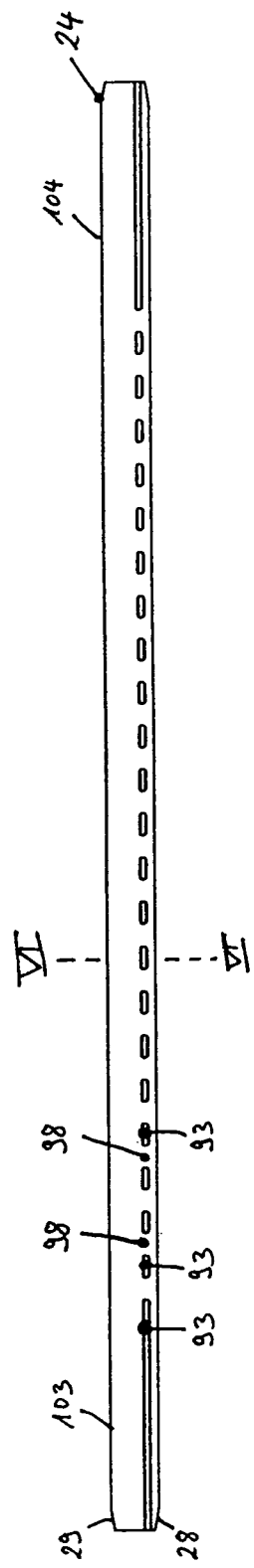

METHOD, HOLDING MEANS, APPARATUS AND SYSTEM FOR TRANSPORTING A FLAT MATERIAL TO BE TREATED AND LOADING OR UNLOADING APPARATUS

CROSS-REFERENCES TO RELATED APPLICATIONS

This application is a 35 U.S.C. §371 U.S. national entry of International Application PCT/EP2010/002481 (WO 2010/121815) having an International filing date of Apr. 22, 2010, which claims under 35 U.S.C. §119 the benefit of German Patent Application No. 10 2009 018 393.0, filed Apr. 22, 2010. The entire contents of both applications are incorporated herein by reference in their entirety.

The invention relates to a method, holding means, a device and a system for transporting a flat material to be treated for an installation for the chemical and/or electrochemical treatment of the material to be treated. The invention also relates to a loading or unloading apparatus for an installation of this kind. In particular, the invention relates to methods and devices of this kind for transporting material to be treated which has a low inherent stiffness, such as foils for example. The invention also relates to methods and devices of this kind in which contact between a usable region, which is to be treated, of the material to be treated, and fixed elements of the installation, can largely be avoided.

In the processing of flat material to be treated, such as for example printed circuit boards in the printed circuit industry, treatment of the material to be treated often takes place in a wet-chemical process line. In conventional installations, the printed circuit boards are often placed on roller conveyors and transported through the installation. For material to be treated which is becoming ever thinner, in particular for foil-type material to be treated, however, transport by roller or cylinder conveyors becomes increasingly difficult, since the material to be treated has a low inherent stability or, because of its low weight per unit of area, can be moved or displaced by spraying it with treatment liquid or rinsing liquid. Furthermore, the surfaces of some substrates and/or the materials, for example lacquers, applied to them in the process line, are so delicate that they could be damaged merely by resting on the rollers.

From DE 10 2007 038 116 A1, a device and a method for transporting substrates, in particular printed circuit boards, are known in which printed circuit boards lying one behind the other are connected by means of holding clips to form a chain. The holding clips extend along the widthwise direction of the printed circuit boards.

The underlying object of the invention is to provide a method, holding means, a device and a system for transporting a flat material to be treated, and also a loading or unloading apparatus for an installation of the type initially mentioned, which allows safe transport of said material, in particular material to be treated which has low inherent stability, for example foil-type printed circuit boards, or which has a delicate surface.

According to the invention, this object is achieved by means of a method, holding means, a device and a system for transporting a flat material to be treated for an installation for the chemical and/or electrochemical treatment of said material, and also by means of a loading or unloading apparatus for an installation of this kind. The dependent claims define preferred and advantageous embodiments of the invention.

The method of transporting a flat material to be treated, in which said material is transported within a plane of transport in a direction of transport, provides for holding means to be attached to the material to be treated which hold said material at at least two points on an edge region of said material, which edge region is directed along the direction of transport when said material to be treated is being transported. The holding means are moved in the direction of transport so as to transport the material to be treated. At least during a portion of the transportation of the material to be treated, a force having a component which lies within the plane of transport and is directed transversely to the direction of transport, is exerted upon at least one region of the material to be treated.

Since, in the case of the method, the material to be treated is mounted on holding means and moved as a result of the movement of said means, it is not necessary to bring said material itself into contact with rollers, cylinders or similar driving means in order to transport it. As a result of the exertion of the force having the component which lies within the plane of transport and is directed transversely to the direction of transport, the material to be treated can be tensioned in the widthwise direction, i.e. in the direction at right angles to the direction of transport and within the plane of transport. In this way, it is possible to safely transport material to be treated which has low inherent stability and/or delicate surfaces, such as conductor foils.

The method may be configured in such a way that the holding means are first of all attached to the material to be treated and are only then coupled to a transporting device belonging to the installation in order to transport said holding means, with the material to be treated mounted thereon, through the installation. The holding means are, in particular, constructed separately from the installation, particularly from the transport system. According to some embodiments, the holding means are, in particular, not connected permanently to the transport system of the installation.

The method may be configured in such a way that the material to be treated is transported through at least two directly consecutive, different treatment stations for the chemical or electrochemical treatment of the material to be treated, without the holding means being removed from said material between the stations. The different treatment stations differ with regard to different ingredients or different concentrations of the treatment solution.

The force having the component which is exerted upon the at least one region of the material to be treated may be chosen in such a way that deflections of said material out of the plane of transport are small, but said material to be treated is not overstretched. The force having said component may also be chosen in such a way that, when the material to be treated is being transported through a treatment station belonging to the installation, an upper side and a lower side of the material to be treated are at the same distance from fixed elements of the treatment station that are provided for the purpose of treating the upper and underside, respectively, of said material. The force having said component may also be chosen in such a way that this distance is constant over the width of the material to be treated.

The force may be exerted, via the holding means, upon the edge region of the material to be treated. For this purpose, a force may be exerted upon the holding means in a direction transverse to the direction of transport and within the plane of transport, at least during the portion of the transportation of the material to be treated, i.e. at least over a portion of the path of transport of said material within the installation.

The material to be treated may be held by further holding means at a further edge region which is directed along the longitudinal direction of said material. Forces in opposite directions, that is to say forces which are directed away from one another and which are directed transversely to the direction of transport, may be exerted upon the holding means and the further holding means.

The force which acts upon the holding means, or upon the holding means and the further holding means, may be chosen in dependence upon properties of the material to be treated. For example, said force may be chosen in dependence upon a maximum permitted deformation of said material to be treated. The force may also be chosen in dependence upon the thickness and, if necessary, further material parameters of the material to be treated, in such a way that the deformation or deflection of said material out of the plane of transport, which deformation or deflection is brought about by forces acting perpendicularly to said plane of transport, remains smaller than a threshold value.

In addition, the holding means may be set up so as to tension the material to be treated parallel to the direction of transport. For this purpose, different portions of the holding means, which portions are pretensioned against one another, for example mechanically, may hold the material to be treated at points which are spaced apart along the longitudinal direction, for example in the vicinity of a front and a rear corner of said material along the edge which is arranged in the longitudinal direction.

The edge region at which the holding means hold the material to be treated may have, in the widthwise direction of said material, i.e. transversely to the direction of transport, a maximum extent which is smaller than a width of the material to be treated. Thus, a relatively large region of the material to be treated may remain accessible for chemical or electrochemical treatment within the installation.

The holding means may be used, not only for mechanical mounting purposes, but also for making electrical contact with the material to be treated. For this purpose, the holding means may be brought into electrically conductive contact with a current-contacting device, for example in the form of a clamp or wheel, when an electrochemical treatment step is to be carried out.

When running through a wet-chemical treatment station, the material to be treated which is mounted on the holding means may be transported through said treatment station in such a way that said holding means are guided past a region of the treatment station in which a treatment fluid is applied to the material to be treated. Since the holding means hold that edge portion of the material to be treated which is directed along the direction of transport, said holding means may, by suitable designing of the treatment station, be guided laterally past the region in which the treatment fluid is applied to the material to be treated. If said material is being rinsed and/or dried, the holding means, together with the material to be treated which is mounted thereon, may be guided through the region for rinsing and/or drying said material so that the holding means are also rinsed and/or dried. It is also possible to provide treatment stations in which the holding means are treated selectively. For example, a treatment station may be designed so as to expose the holding means, but not the usable region of the material to be treated, to a flow of treatment fluid.

The material to be treated may be a material which has low inherent stiffness, for example a foil. Said material to be treated may also be a continuous material.

The holding means which are provided according to one aspect of the invention are configured to hold the material to be treated at at least two points in an edge region of said material. Said holding means are configured for detachable coupling to a transporting device belonging to an installation for the chemical and/or electrochemical treatment of the material to be treated, for the purpose of transporting said material along a direction of transport, and are so designed that, in a state in which they are coupled to the transporting device, they hold the material to be treated in such a way that the edge region of said material, in which the holding means hold the latter, extends along the direction of transport.

Holding means designed in such a way are capable of stabilising that edge region of the material to be treated which is directed in the direction of transport when said material is being transported.

The holding means may be so designed that they comprise a holding rail with a longitudinal axis. Said holding rail may be constructed so as to act upon the material to be treated in a stiffening manner in such a way that said rail suppresses bending or kinking of the material about a first and second axis, which axes are directed perpendicularly to the longitudinal axis of the holding rail in each case. Said holding rail may be so constructed that, in a state in which it is coupled to the transporting device, the longitudinal axis of the holding rail is parallel to the direction of transport. In the state in which they are coupled to the transporting device, the holding means may thus be set up so as to absorb bending forces acting upon the material to be treated, in such a way that bending or kinking of said material about a first and second axis, which axes are perpendicular to the direction of transport in each case, is counteracted.

The holding means may comprise a first holding part and a second holding part, which parts have a closed condition for holding the material to be treated and an open condition for the insertion of said material. The first and second holding parts may, for example, be constructed as separate parts which may be completely separated from one another when in the open condition. Said first and second holding parts may be configured to mount the material to be treated, at least by means of a force-locking connection, when in the closed condition. Alternatively or in addition, the material to be treated may also be held in a form-locking manner. The holding means may comprise force means which, when said holding means are in the closed condition, exert an attractive force between the first and second holding parts. Said force means may comprise magnets on or in the holding parts.

The holding means may be constructed in such a way that, in the state in which they are coupled to the transporting device, they overlap the material to be treated in the direction at right angles to the direction of transport over a distance which is smaller than the width of said material. Thus it is possible for a relatively large region of the material to be treated, which is mounted by means of the holding means, to remain accessible for the chemical or electrochemical treatment within the installation.

The holding means may comprise a holding rail in which passages for liquid are formed. Holding means designed in this way make it possible for liquid, for example treatment or rinsing liquid, to be conducted away from the material to be treated through the holding means.

Said holding means may be constructed so as to displace a driving roller or driving cylinder belonging to the transporting device, which roller or cylinder is movable transversely to the direction of transport, transversely to said direction of transport. For this purpose, the holding means may have, for example, a bevelled side or a chamfered end which grasps the driving roller or driving cylinder and displaces it transversely to the direction of transport, while the holding means move relative to said driving roller.

The holding means may be set up so as to make electrical contact with material to be treated. For this purpose, said holding means may comprise at least one electrically conductive contact face which is set up so as to touch the material to be treated, and a further electrically conductive contact face which is so arranged that it can be coupled to an external contact element when the holding means are holding the material to be treated. The electrically conductive contact face and the further electrically conductive contact face may be connected in an electrically conductive manner by a conductor portion provided in the holding means. The further electrically conductive contact face may have two portions which are arranged on opposite sides of the holding means when the latter are holding the material to be treated. By pressing two contact elements against the two portions, it is possible to achieve good electrical contact with the material to be treated as well as good mechanical mounting of said material within the holding means.

The device which is provided, according to one aspect of the invention, for transporting a flat material to be treated which is mounted along an edge region by means of holding means, for an installation for the chemical and/or electrochemical treatment of said material, comprises transporting means which can be coupled to the holding means in a detachable manner and which are configured to move said holding means, with the material to be treated mounted thereon, in a direction of transport. The device configured to exert, at least during one portion of the transportation of the material to be treated, a force having a component which lies within one plane of transport and is directed transversely to the direction of transport, upon at least one region of the material to be treated.

Since the transporting means of the device can be coupled to the holding means which hold the material to be treated, it is not necessary to bring said material itself into contact with rollers, cylinders or similar driving means, in order to transport it. As a result of the exertion of the force having the component which lies within the plane of transport and is directed transversely to the direction of transport, the material to be treated can be tensioned in the widthwise direction, i.e. in the direction at right angles to the direction of transport.

The device may have tensioning means for exerting a force upon the holding means in a direction transverse to the direction of transport and within the plane of transport. The tensioning means may comprise a movable bearing which can be moved transversely to the direction of transport and is configured for guiding the holding means. Said movable bearing may be attached to a driving shaft. Force means, for example a pair of magnets or a springy element, may be provided so as to exert a force upon the movable bearing transversely to the direction of transport. This design makes it possible to exert upon the holding means, via the movable bearing in which said holding means are guided, a force by means of which it is possible, in turn, to tension the material to be treated in the widthwise direction.

The material to be treated which is transported by the device may be mounted along a further edge region by means of further holding means. The device may comprise further tensioning means which are set up so as to exert a force upon the further holding means in a direction transverse to the direction of transport and within the plane of transport. In particular, the tensioning means and the further tensioning means may be set up so as to exert forces in opposite directions upon the holding means and the further holding means. The further tensioning means may comprise a further movable bearing upon which a force is exerted transversely to the direction of transport.

The system which is provided, according to one aspect of the invention, for transporting a flat material to be treated, which is held along an edge region by holding means, for an installation for the chemical and/or electrochemical treatment of said material, comprises a device for transporting the material to be treated according to an embodiment, and holding means for holding said material which are coupled to the transporting means of the device in a detachable manner. The holding means may be constructed as holding means according to an embodiment.

According to a further aspect, a loading or unloading apparatus for an installation for the chemical and/or electrochemical treatment of the material to be treated, which installation has a device for transporting a material to be treated which is held along an edge region, is provided. The loading or unloading apparatus may be used as a loader or as an unloader for an installation of this type. Said loading or unloading apparatus is set up so as to transfer the holding means between a closed condition for holding the material to be treated and an open condition, and comprises a supporting apparatus for supporting said material when the holding means are transferred into the open condition.

A loading or unloading apparatus of this type makes it possible to attach the holding means to the material to be treated so as to then feed said material, which is held by the holding means, to the installation for treatment, or to remove the holding means from the material to be treated after it has been treated in the installation. The supporting apparatus supports the material to be treated when the holding means are in the open condition. Said supporting apparatus may comprise, for example, a vertically adjustable perforated plate, or an air nozzle for generating an air cushion, which plate or cushion is capable of supporting the material to be treated.

The loading or unloading apparatus may be configured to receive the holding means in the closed condition, transfer them from the closed condition into the open condition and then back into the closed condition, and to pass them out in the closed condition.

The loading or unloading apparatus may comprise first engaging means for engagement with a first holding part of the holding means, and second engaging means for engagement with a second holding part of the holding means. The first and second engaging means may, for example, each comprise a profiled face, which faces engage, in a form-locking manner, with a complementary face on the first holding part and second holding part respectively. Moving means for bringing about a relative movement of the first engaging means and second engaging means may be provided so as to transfer the first holding part and the second holding part between the open condition and the closed condition.

The moving means may be set up so as to exert a force which is variable as a function of the path covered in the course of the relative movement. For example, it is possible to exert a relatively high force initially, until the holding parts have been separated from one another by a predetermined distance. The force exerted by the moving means may then assume a lower value so as to separate the holding parts from one another still further. The relatively high force may be exerted over a path which is smaller than the path over which the lower force is exerted.

Embodiments of the invention make it possible to transport material to be treated, in particular even material to be treated which has a low inherent stability, such as foils for example, safely through an installation for the chemical and/or electrochemical treatment of said material to be treated.

The invention will be explained in greater detail below with the aid of preferred or advantageous embodiments, with reference to the appended drawings.

FIGS. 7A and 7B are plan views of the first and second holding parts of the holding means from FIG. 6.

Directional or positional details which relate to the material to be treated are conventionally indicated with reference to the direction of transport. The direction which is parallel or anti-parallel to the direction of transport during the transportation of the material to be treated, will be referred to as the "longitudinal direction", and the direction lying in the plane of transport, orthogonally to the direction of transport, will be referred to as the "widthwise direction" of the material to be treated.

"Detachable coupling" of elements or apparatuses is to be understood to mean coupling of this type which makes it possible to separate the elements or apparatuses from one another without damaging or destroying said elements or apparatuses. "Detachable coupling" between holding means and material to be treated will thus be understood to mean coupling in which the holding means can be removed from the material to be treated without destroying said holding means or said material or damaging them in such a way that their functioning is impaired. "Detachable coupling" between holding means and transporting device is understood to mean coupling in which the holding means can be removed from the transporting device without destroying said holding means or said transporting device or damaging them in such a way that their functioning is impaired.

Figure 1:
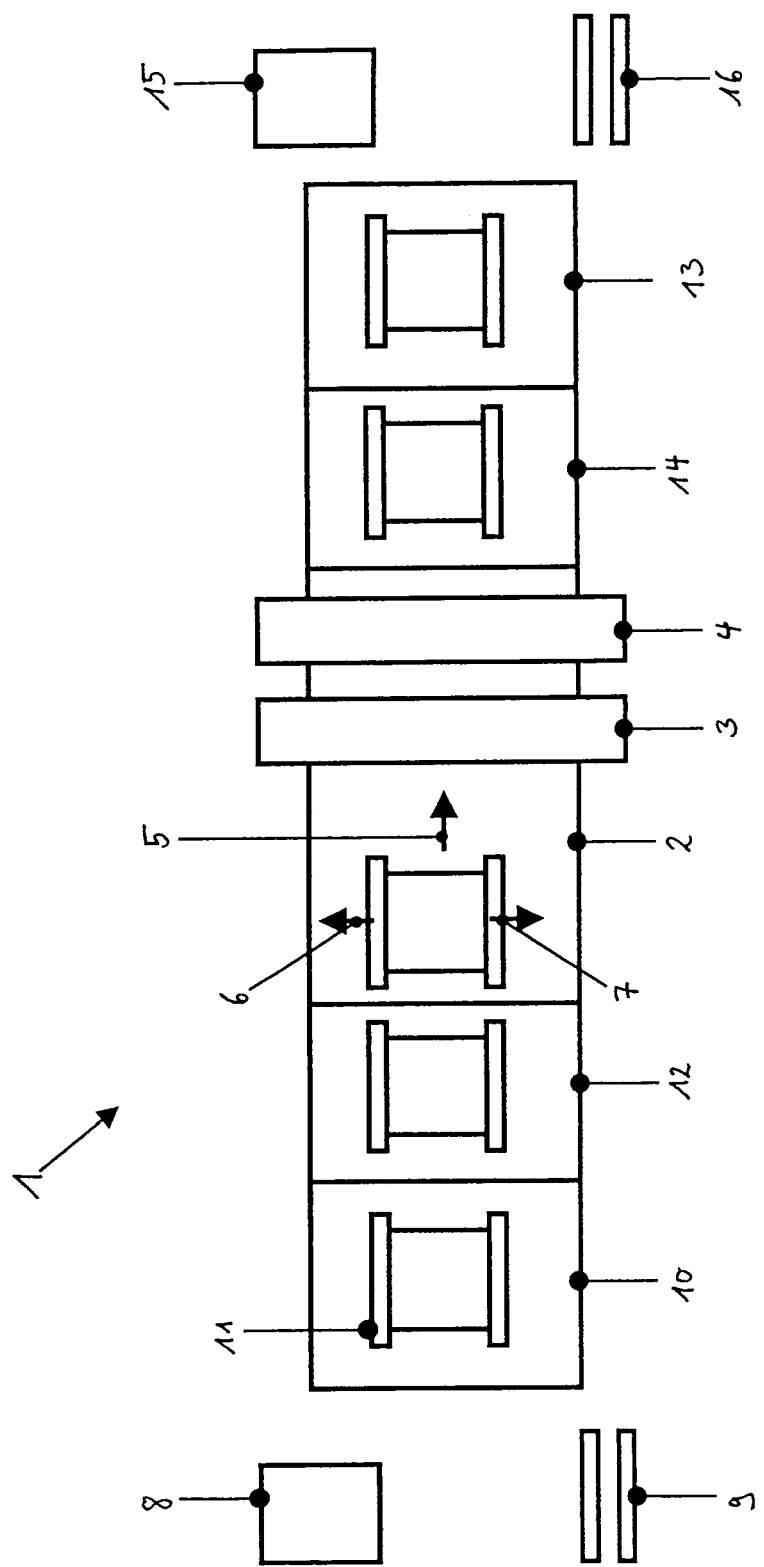
FIG. 1 is a diagrammatic representation, according to an embodiment, of the transportation of material to be treated through an installation for the treatment of said material.

FIG. 1 shows diagrammatically an installation 1 for the chemical and/or electrochemical treatment of flat material to be treated which may be constructed, for example, in the form of thin sheets or foils. The installation 1 comprises a process line 2 having a number of treatment stations at which the material to be treated is subjected to a chemical and/or electrochemical treatment, is rinsed or is dried. Treatment stations 3, 4 are represented diagrammatically. The material to be treated is transported in one direction of transport 5 within the process line 2, and is thus fed to the treatment stations 3, 4. Even though a process line 2 having two treatment stations 3, 4 is represented in the case of the installation 1, it is generally possible to provide any desired number of treatment stations which are suitably adapted to the particular application. At the treatment stations, one or more of the following: a treatment fluid, electric current, energy, a pulse or radiation may, for example, be fed to the material to be treated, or else said material may be set in vibration, etc.

As will be described again in greater detail, the material to be treated is mounted at an edge region, or at a number of edge regions, by means of holding means. Said holding means are designed and guided in such a way that the longitudinal edges of the material to be treated, i.e. the edges of said material which extend parallel to the direction of transport, lie within a plane, or substantially within a plane, which will be referred to as the "plane of transport" of the material to be treated.

Apparatuses and methods according to various embodiments make it possible to hold and transport material to be treated which has low inherent stiffness in such a way that deviations of the various regions of said material from the plane of transport remain small. Reference to a "transportation of the material to be treated within one plane of transport", however, does not preclude the possibility of individual portions or regions of said material being deflected out of the plane of transport while the material to be treated is being transported. Thus, for example, the force of gravity acting upon the material to be treated, the exposure of said material to a flow of fluid, or the like, may lead to deflection of regions of the material to be treated out of the plane of transport. Said material may, for example, be transported in a horizontal plane of transport. For the purpose of transporting the material to be treated through the process line 2, the installation 1 is equipped with a transporting device. An embodiment of a transporting device which can be used for transporting the material to be treated in the case of the installation which is represented diagrammatically in FIG. 1, will be described in greater detail with reference to FIGS. 3 and 4.

In order to transport the material to be treated within the process line 2 of the installation 1, the holding means are attached to said material in a detachable manner. The holding means are taken off again, or removed again from, the material to be treated, after the latter has been transported through the process line 2.

The installation 1 further comprises a loading apparatus or loader 10. The material to be treated is fed to the loading apparatus 10 from a suitable stock 8 of said material, for example using a robot (not represented in FIG. 1) or the like. Holding means are also fed to the loading apparatus 10 from a stock 9 of said holding means. The loading apparatus attaches the holding means to an edge region of the material to be treated, so that said holding means hold said material at a number of points on the edge region. As will be explained again in greater detail, the holding means hold the material to be treated along an edge portion on that edge of said material which is directed parallel to the direction of transport. The holding means may hold the material to be treated at a number of points or regions within the edge portion which are arranged in a spaced-apart or continuous manner within the latter. In an embodiment, the holding means hold the material to be treated at least in the vicinity of the two corners of said material which delimit that edge region of the latter which extends parallel to the direction of transport. In a further embodiment, the holding means hold the material to be treated at least in the vicinity of the two corners of the material to be treated which delimit that edge region of said material which extends parallel to the direction of transport, and in a central portion of said edge region which is disposed between them.

The installation 1 may also have a cushioning apparatus 12 which is arranged downstream of the loading apparatus 10, and upstream of the process line 2, in the direction of transport. Said cushioning apparatus 12 receives the material to be treated 11, which is mounted by the holding means, from the loading apparatus 10. The cushioning apparatus 12 transports the mounted material to be treated 11 onwards to the process line 2 and may, at the same time, be set up in such a way that it accelerates or brakes the material to be treated 11, which is mounted by means of the holding means, to a speed which corresponds to the initial speed of said material within the process line 2. Further functions may be integrated into the cushioning apparatus 12. For example, said cushioning apparatus 12 may be designed so as to tension the mounted material to be treated 11 in the direction transverse to the direction of transport. The cushioning apparatus 11 may also have various sensors and controllable driving elements so as to set the distance between consecutive substrates or materials to be treated.

During the transportation of the material to be treated within the process line 2, the transporting device of the installation 1 acts upon the holding means which hold said material. The transporting device moves said holding means so as to move the material to be treated, which is mounted on them, in the direction of transport 5.

While the material to be treated is being transported within the process line 2, forces having components 6, 7 are exerted upon the edge regions of the material to be treated which extend parallel to the direction of transport, i.e. the longitudinal edges. The components of force 6, 7 are directed in such a way that they lie within the plane of transport and are directed at right angles or transversely to the direction of transport. The components of force 6, 7 which act upon the two edge portions of the material to be treated which extend parallel to the direction of transport have the same magnitude and are directed oppositely to one another. Under these circumstances, the magnitude of said components of force 6, 7 may be chosen in such a way that they tension the material to be treated. The magnitude of the components of force 6, 7 may also be chosen in such a way that they hold the material to be treated close to, or within, the plane of transport over the width of said material, without overstretching the latter. The magnitude of the components of force 6, 7 may also be chosen in such a way that the upper side and underside of the material to be treated are at a distance from fixed elements of treatment stations provided for treating said upper side and underside, which is substantially constant over the width of said material to be treated.

The installation 1 also has an unloading apparatus 13 or unloader 13 which receives the material which has been treated. Between the process line 2 and the unloading apparatus 13, a further cushioning apparatus 14 may be provided, to which the material which has been treated is fed by the process line 2 and which feeds said material to the unloading apparatus 13. Said unloading apparatus 13 removes the holding means from the material to be treated. Said material 15 which has been treated can be taken out of the device 1 and then fed to a further processing arrangement.

After the holding means have been removed following the treatment of the material to be treated, the holding means 16 can also be removed from the device 1 and used again for mounting a further material to be treated. After running through the installation 1 once or a number of times, the holding means 16 may, if necessary, be subjected to a cleaning process in order to remove from said holding means 16 deposits which have settled on the latter in the course of the preceding run or runs through the installation 1.

Embodiments of holding means and a transporting device which can be used for transporting the goods to be treated in the case of an installation such as is represented diagrammatically in FIG. 1, will be described in more detail with reference to FIGS. 2 to 8.

Figure 2:
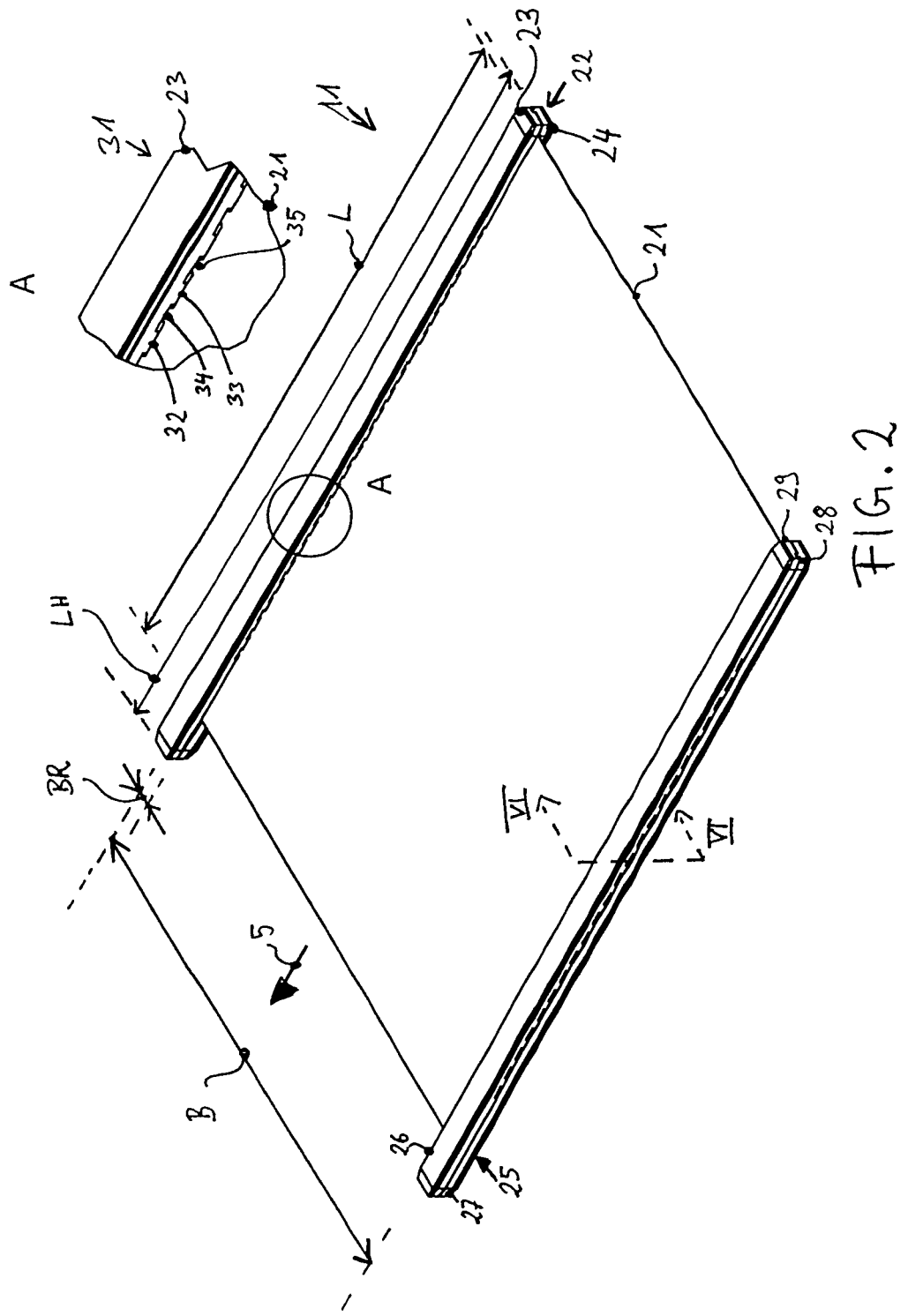
FIG. 2 is a perspective view of a foil which is mounted by means of holding means according to an embodiment.

FIG. 2 is a perspective view of a material to be treated which is held by holding means. Said material to be treated 21 is represented as a thin sheet or foil with a substantially rectangular shape. At the two longitudinal edges of the material to be treated 21, i.e. the two edges which are directed along the direction of transport when the material to be treated is being transported, holding means 22 and further holding means 25 hold said material at at least two points, in each case, on the edge portions of said material 21. In the embodiment represented, the holding means 22 and further holding means 25 each hold the corresponding edge region in the vicinity of the corners of the material to be treated, as well as at a plurality of points arranged between said corners.

The holding means 22 and further holding means 25 are designed in such a way that they overlap the material to be treated 21 in the widthwise direction, i.e. in the direction which extends, within the plane of transport, at right angles to the direction of transport when the material to be treated 21 is being transported, over a maximum distance BR which is small compared to a width B of said material 21. The holding means may have a width of about 5 to 45 mm, in particular about 10 to 35 mm, in particular about 15 to 30 mm, and may accordingly overlap the material to be treated over a width BR which is smaller than the width of said holding means.

The holding means 22 and further holding means 25 may be designed in such a way that their length LH corresponds to the length L of the material to be treated 21 or is greater than said length. The holding means 22 and further holding means 25 may, according to the material to be treated 21, hold said material in the vicinity of its corners. As is represented in FIG. 2, the holding means 22 and further holding means 25 may be constructed in such a way that they protrude beyond the material to be treated 21 in the longitudinal direction on one or both sides of said material when they are in the condition in which they are holding the latter. In the embodiment represented in FIG. 2, the length LH of the holding means 22 and further holding means 25 is chosen, for this purpose, in such a way that it is greater than the length L of the material to be treated 21. The portions of the holding means 22 and further holding means 25 which protrude beyond the material to be treated 21 in the longitudinal direction may serve to set a minimum distance between materials to be treated within the installation. Said holding means 22 and further holding means 25 may be attached to the material to be treated 21 in such a way that they jut out further from said material at their end which is the front end in the direction of transport 5, than at their end which is the rear end in said direction of transport 5.

In the embodiment represented in FIG. 2, the holding means 22 and further holding means 25 are constructed in the shape of rails and have a length LH which is long, compared to the dimensions of the holding means 22 or further holding means 25, in the directions which are perpendicular thereto. Even though the holding means 22 and further holding means 25 are represented as continuous rails in FIG. 2, said holding means may also have a number of portions which are spaced apart in the longitudinal direction of the material to be treated and are connected to one another so as to hold said material to be treated 21 at a number of points in the edge region. These portions, of which there are a number, may be connected to one another by means of springy elements which are constructed in such a way that said portions are pretensioned away from one another in the longitudinal direction, i.e. that forces which are directed away from one another can be exerted upon the portions of the holding means in the longitudinal direction. The material to be treated can also be tensioned in its longitudinal direction by means of the holding means.

The holding means 22 have a rail-shaped first holding part 23 and a rail-shaped second holding part 24. Similarly, the further holding means 25 have a rail-shaped first holding part 26 and a rail-shaped second holding part 27. When the holding means 22 or 25 are in the closed condition represented in FIG. 2, the first holding part 23, 26 and the second holding part 24, 27 are arranged on opposite sides of the material to be treated 21, in such a way that the edge region of said material protrudes inwards between the first holding part 23, 26 and the second holding part 24, 27 and is held at that point.

The detail A, which is represented at 31 in FIG. 2, will be described next. The cutaway portion, which is designated by A, of the mounted material to be treated 21 is represented in an enlarged manner in a detail view at 31. The upper holding part 23 has a contact edge with a number of portions 32, 33 which protrude in the direction of the material to be treated 21. Those end faces of the portions 32, 33 of the contact edge which face towards the material to be treated 21 touch said material and hold it in a force-locking manner. Clearances 34, 35 are provided between the portions 32, 33 of the holding edge. Said clearances 34, 35 form passages for liquid which make it possible to conduct treatment liquid away through the holding means 22. The further holding means 25 have a corresponding design which is mirror-symmetrical to that of the holding means 22.

In a further design, the holding means 22 and the further holding means 25 are of identical design. Each of the holding means 22 and further holding means 25 may be constructed in such a way that the upper and lower holding parts are mirror-symmetrical to one another, relative to the plane of transport. Said upper and lower holding parts may be connected, for example by a hinge.

The ends of the holding means 22 and the further holding means 25 have bevelled surfaces 28, 29. In an embodiment, said bevelled surfaces 28, 29 are constructed at least at that end of the holding means 22 which is coupled to the transporting device of the installation first when the material to be treated is being transported. Under these circumstances, the bevelled surfaces 28, 29 may be so arranged, in relation to one another, that the holding means 22 become narrower in the direction of their ends, so as to facilitate the introduction of said holding means 22 into the transporting device of the treatment installation.

The holding means 22 and the further holding means 25 may be coupled to a suitably constructed transporting device of a treatment installation in order to transport the material to be treated 21 which is held by said holding means 22 and further holding means 25. Under these circumstances, the coupling of the transporting device to the holding means advantageously takes place in such a way that the central region of the material to be treated 21 which, as the usable region of said material, is subjected to a treatment, does not come into contact with elements of the transporting device and also, advantageously, does not come into contact with other fixed elements of the process line, until the holding means 22 and the further holding means are released again from the material to be treated 21.

Figure 3:
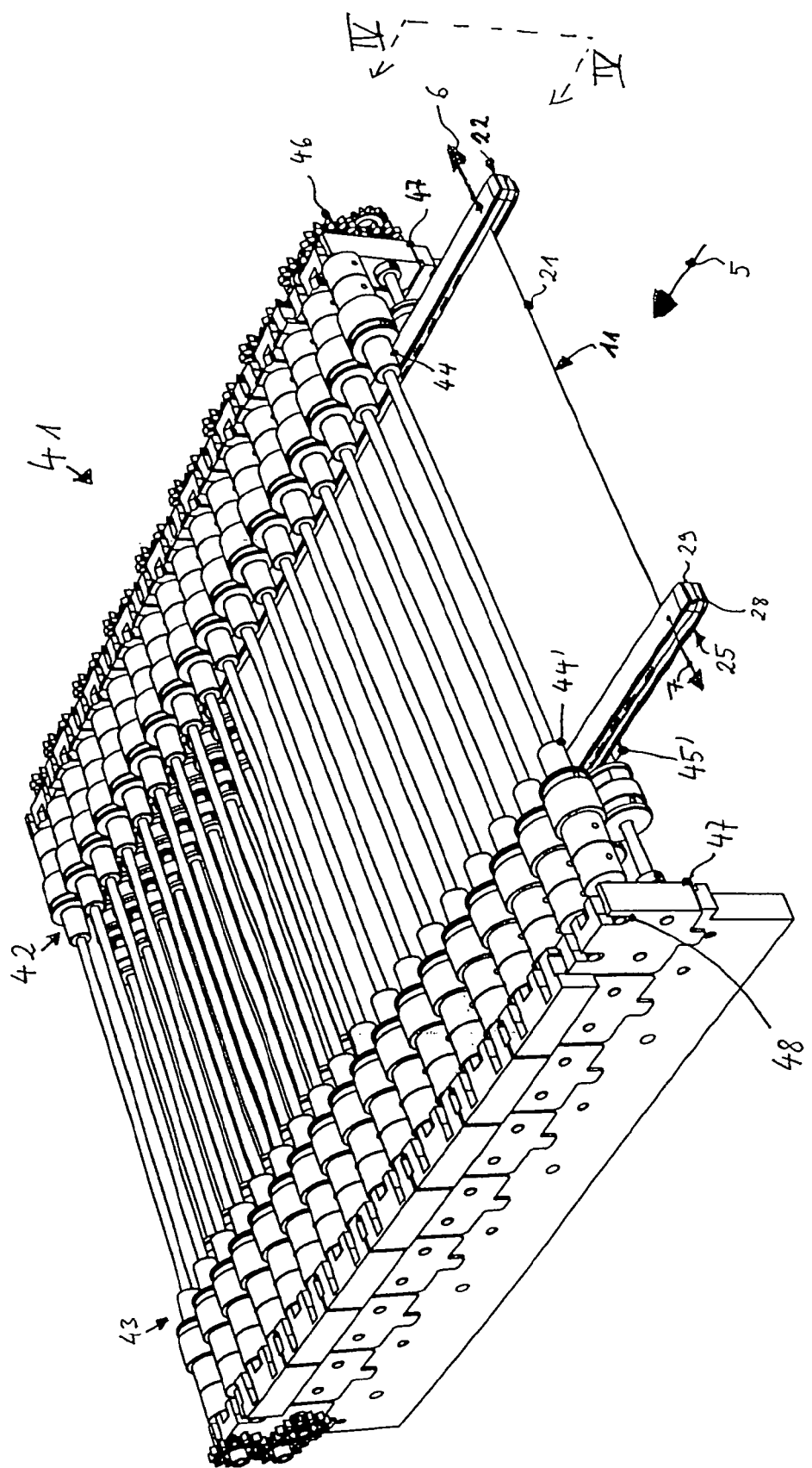
FIG. 3 is a perspective view of a transporting device according to an embodiment.

FIG. 3 is a perspective view of a transporting device 41 according to an embodiment, which can be used for transporting the material to be treated which is mounted by means of holding means. Said transporting device 41 may be used as the transporting device in the process line 2 of the installation 1 from FIG. 1.

The transporting device 41 has two roller conveyors 42, 43 which are arranged, in a manner spaced apart from one another, at the sides of the transport path of the material to be treated. Each of the roller conveyors 42, 43 comprises a plurality of pairs of rollers which are arranged along the direction of transport. Each of the pairs of rollers comprises two rollers which are spaced apart perpendicularly to the plane of transport. In the transporting device 41 represented in FIG. 3, the rollers 44', 45' are arranged so as to be spaced apart vertically, so that one roller 44' is arranged above, and a further roller 45' below, the horizontal plane of transport within which the material to be treated 21 is transported.

In the case of the transporting device 41, a roller 44' of the roller conveyor 43, which roller is arranged above the plane of transport, and a roller 44 which is arranged at the corresponding position of the other roller conveyor 42, are each connected to a shaft. The rollers arranged below the plane of transport are correspondingly connected to a shaft. The shafts by means of which the rollers 44, 44', 45' can be driven in a rotating manner are mounted on bearing inserts 47 belonging to the transporting device 41. At least one of the shafts is mounted so as to be displaceable relative to the other shaft, for example within a vertically extending clearance 48 in the bearing insert 47. Since the vertical distance between the rollers belonging to a pair of rollers can be varied in the case of a mounting arrangement of this kind, it is possible to transport, for example, materials to be treated which have different thicknesses. On one side of the transporting device—the same side as the roller conveyor 42 in the case of the transporting device 41—the shafts are connected in a rotationally fixed manner to a pair of gearwheels 46 which are operatively connected to a driving unit (not represented) via a driving shaft (likewise not represented).

The transporting device 41 transports the material to be treated 21, which is held by the holding means, in the direction of transport, said transporting device 41 touching the holding means 22, 25 while that central usable region of the material to be treated 21 which is to be treated is not touched by fixed elements of said transporting device. The central region of the material to be treated 21, which region is subjected to a treatment, comes into contact with liquids or gases in the treatment stations of the treatment installation.

The transporting device 41 is constructed in such a way that it exerts, upon each of the holding means 22, 25 which hold the material 21 to be treated at the longitudinal edge of said material, a force having a component 6, 7 on the holding means 22, 25 which is directed within the plane of transport and transversely to the direction of transport. Under these circumstances, the transporting device 41 exerts, upon the holding means 22, 25, forces having the components 6, 7 with an opposite direction so as to tension the material to be treated 21 in the direction transverse to the direction of transport.

In order to guarantee synchronous transportation of the holding means 22, 25 on both sides of the material to be treated 21, the transporting device 41 may be provided with a synchronising apparatus (not represented). Said synchronising apparatus may be set up so as to ensure a synchronous advance of the holding means 22, 25 attached on different sides of the material to be treated 21. The synchronising apparatus may be realised in such a way that a movement of the holding means in the direction of transport is impeded by means of a stop and said holding means can be released again at a desired point in time. For this purpose, the synchronising apparatus may comprise at least one movable element and a driving mechanism which is connected thereto and by means of which said at least one movable element can be moved between a first position, in which the at least one movable element is in engagement with one or both of the holding means 22, 25 so as to prevent an advance of the corresponding holding means in the direction of transport, and a second position, in which said movable element is positioned in such a way that it permits the advance of the corresponding holding means. It is possible to provide a first movable element, for example a first controllable stop, so as to regulate the advance of the holding means 22 on the first side, and a second movable element, for example a second controllable stop, so as to regulate the advance of the holding means 25 on the second side. Other designs of the synchronising apparatus are possible. For example, said synchronising apparatus may have gearwheels which engage in the holding means 22, 25 during transportation so as to bring about a synchronous and well-defined advance of the holding means which are attached to different sides.

As will be explained in greater detail next, with reference to FIG. 4, at least one of the rollers, in each case, belonging to each pair of rollers, for example the roller 45 which is provided below the plane of transport, is constructed as a movable bearing in at least one of the roller conveyors 42, 43. The movable bearing is constructed for the purpose of guiding the corresponding holding means 22 or 25. It exerts upon the associated holding means 22 or 25 a force having a component 6, 7, transverse to the direction of transport, which is transmitted, via said holding means 22 or 25, to the corresponding edge region of the material to be treated.

Figure 4:
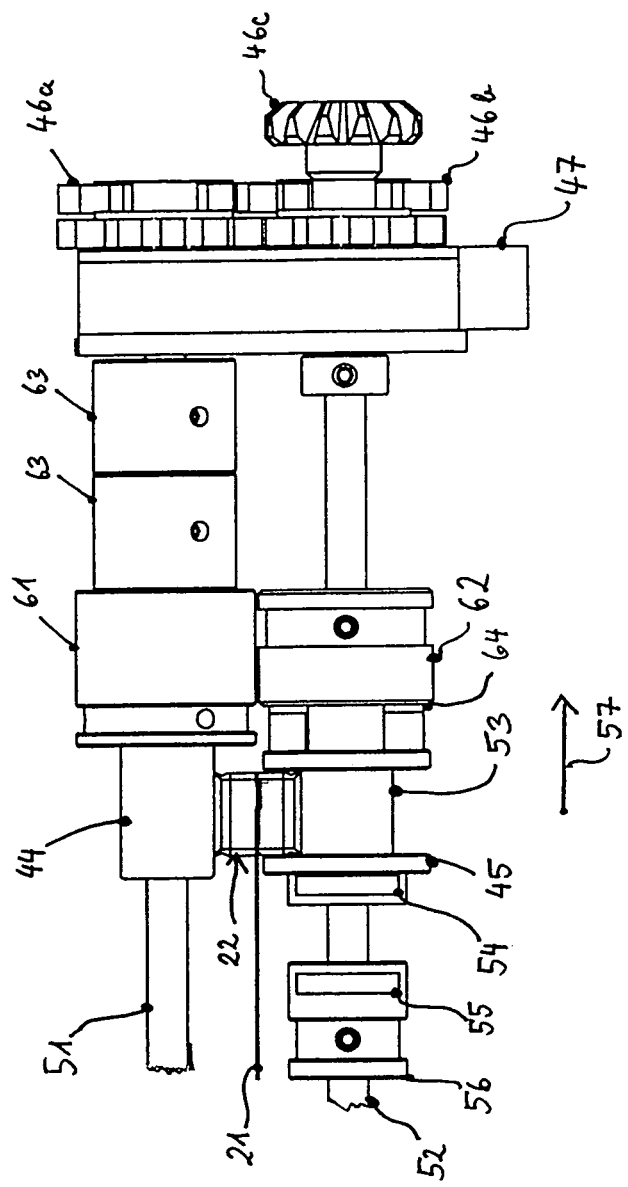
FIG. 4 is a side view of a portion of the transporting device from FIG. 4.

FIG. 4 shows a plan view of a pair of rollers belonging to the roller conveyor 42, from the direction designated by IV-IV in FIG. 3. In this instance, the direction of transport is directed into the plane of the drawing and the plane of transport intersects said plane of the drawing in the horizontal direction. Elements which have already been explained with reference to FIG. 3 are provided with the same reference symbols.

Even though a pair of rollers belonging to the roller conveyor 42 is being explained with reference to FIG. 4, the pair of rollers belonging to the roller track 43 may have a design which is identical, from the functional point of view, and may be constructed so as to be mirror-symmetrical to the configuration represented in FIG. 4. In particular, movable bearings may be provided, both in the roller conveyor 43 and in the roller conveyor 42, so that the material to be treated is mounted in a floating manner. In a modified embodiment of the transporting device 41, a roller is designed as a movable bearing in only one of the roller conveyors 42, 43, while the other roller conveyor guides the associated holding means at a predetermined position and acts as a fixed bearing.

The pair of rollers comprises the rollers 44, 45, which are arranged in such a way that the holding means 22 which are holding the material to be treated 21 can be transported between them. The roller 44 is attached to a shaft 51. The roller 45 is attached to a further shaft 52. The shaft 51 is coupled in a rotationally fixed manner to a gearwheel 46*a*, and the further shaft 52 is coupled in a rotationally fixed manner to a gearwheel 46*b*. The gearwheels 46*a* and 46*b* are in engagement so that, when the gearwheel 46*b* is rotated, the gearwheel 46*a* is also driven in a rotating manner. Said gearwheel 46*b* is coupled to a bevel gear 46*c* which is in operative connection with a driving shaft (not represented).

The roller 45 has a guide groove 53 for the holding means 22. Said roller 45 is attached to the shaft 52 in such a way that it is axially displaceable along said shaft 52 over a certain range. In this way, the roller 45 forms a movable bearing for the holding means 22, on which the latter is mounted in such a way that it is moved in the direction of transport by rotation of the rollers 44, 45. Because of the axially movable mounting of the roller 45 along the shaft 52, it is possible to exert, upon the holding means 22 and thus upon that edge region of the foil which is held by said holding means 22, a force having a component within the plane of transport transverse to the direction of transport. The roller 44 has a cylindrical superficies. The superficies of the roller 44 is designed in such a way that said roller 44 is able to touch the holding means 22, irrespective of the position of the roller 45 with the guide groove 53, on that side (at the top in FIG. 4) of the holding means 22 which is the opposite side from the guide groove. The transporting device may advantageously be constructed in such a way that the friction-locking connection operating between the roller 45 and the holding means 22 is able to guarantee slip-free transportation of said holding means 22. As will be described again in greater detail below, weights may be provided for the purpose of increasing the force with which the roller 44 presses the holding means 22 into the guide groove 53 and against the roller 45.

The transporting device comprises force means which exert upon the roller 45 a force parallel to the shaft 52. In the case of the design represented in FIG. 4, the force means comprise a magnet 54 which is attached to the roller 45, and a further magnet 55 which is held by a mounting arrangement 56 at a fixed axial position along the shaft 52. The magnets 54, 55 may be constructed as permanent magnets. The magnet 54 attached to the roller 45, and the further magnet 55, are set up so that a repelling force operates between them. The repelling force between the magnets 54, 55 leads to the fact that a force 57 acts upon the roller 45 in the axial direction along the shaft 52. When the holding means 22 travel into the guide groove 53, the roller 45 is able to perform a movement in the axial direction along the shaft 52 and exerts the force 57, transversely to the direction of transport, upon the holding means 22 via the edge of said guide groove 53. In this way, the material to be treated 21 can be tensioned in a resilient manner by the transporting device 41.

In order to permit the transportation of material to be treated 21 having a different thickness, or the use of holding means of different design, the shaft 51 is mounted on the bearing insert 47 so as to be movable, relative to the shaft 52. For example, the shaft 51 is capable of moving in the vertical direction, relative to the shaft 52. A rotational entrainment means 62 is attached to the shaft 52. A clutch 64 is provided between the rotational entrainment means 62 and the roller 45 for the purpose of transmitting a torque from the shaft 52 to said roller 45. Said clutch 64 is designed in such a way that the axial movement of the roller 45 along the shaft 62 is possible while the clutch 64 for transmitting the torque remains engaged. Attached to the shaft 51 is a stop element 61 which is capable of coming into contact with the rotational entrainment means 62 so as to limit the movement of the shafts 51, 52 towards one another. The stop element 61 and the rotational entrainment means 62 are designed in such a way that the holding means 22 are capable of travelling, with their chamfered end, securely into the intervening space between the guide groove 53 of the roller 45 and the roller 44 when the stop element 61 and the rotational entrainment means 62 are bearing against one another. Weights 63 are attached to the shaft 51 in order to increase the force with which the roller 44 presses the holding means 22 into the guide groove 53 and against the roller 45. In this way the friction-locking connection between the rollers 44, 45 and the holding means 22 can be improved, and said holding means 22 can be secured in the guide groove 53 of the roller 45.

Modifications to that construction of the pair of rollers of the transporting device which has been explained with reference to FIG. 4 can be implemented in further embodiments. For example, instead of the guide groove 53 of the roller 45 in which the outer face of the holding means 22 engages, other complementary engaging portions, by means of which an axial force acting upon the roller 45 along the shaft 52 is transmitted to the holding means 22, may be provided on a roller belonging to the transporting device and on the holding means.

The force acting upon the holding means 22 in the widthwise direction of the material to be treated 21 must not be exerted upon said holding means 22 via the roller 45. In a further embodiment, the magnet 54 may, for example, not be arranged on the roller 45 itself but on an element which is separate therefrom and which is set up so as to exert, upon the holding means 22, a force having a component in the widthwise direction of the material to be treated.

In a further embodiment, a magnetic force may be exerted upon the holding means 22, not indirectly via a movable bearing but directly by a magnet, such as the permanent magnet 55, mounted on the shaft 52. Permanent magnets, which interact with the magnet mounted on the shaft 52, may be provided in the holding means 22. The magnet mounted on the shaft 52 and the permanent magnets in the holding means 22 may be constructed and arranged in such a way that there is exerted, upon said holding means 22, a force having a component which is directed in such a way that the material to be treated is tensioned in the widthwise direction. The roller 45 may be constructed with a cylindrical superficies along which the holding means 22 are able to move in the widthwise direction of the material to be treated 21 under the effect of the force which is exerted upon said holding means 22 by the magnet mounted on the shaft 52.

Instead of the magnets 54, 55, use may be made of other suitable means in order to exert, upon the holding means 22, a force having a component in the plane of transport and transverse to the direction of transport, which tensions the material to be treated in a resilient manner. For example, use may be made of a springy element in order to exert, upon the roller 45, a force along the shaft 52.

In a further embodiment, the holding means 22 may be exposed to a flow of fluid transversely to their longitudinal direction, i.e. in the widthwise direction of the material to be treated, so as to exert, upon said holding means 22, a force which is directed in such a way that the material to be treated 21 is tensioned in the widthwise direction.

Figure 11:
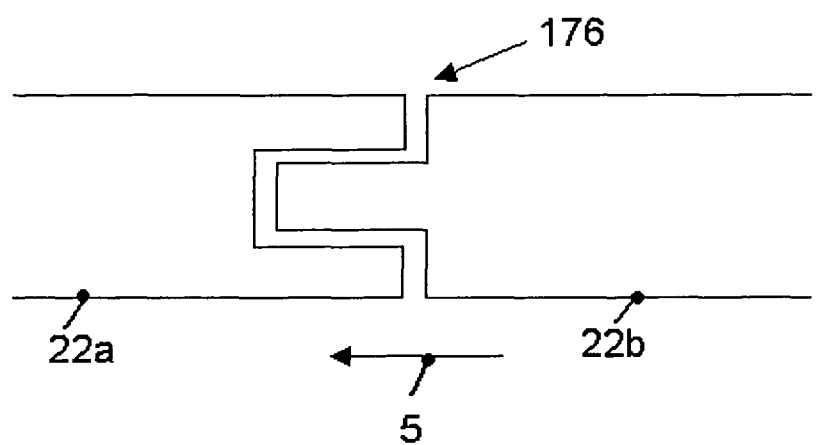
FIG. 11 is a plan view of end portions of adjacent holding means according to an embodiment.

FIG. 11 shows a coupling 176 between adjacent holding means 22a and 22b, by means of which it is possible, according to an embodiment in the case of the various methods and apparatuses described herein, to achieve an interlacing between the adjacent holding means 22a and 22b. The end portions of the holding means are designed in such a way that forces are transmitted from one holding means 22a to an adjacent holding means 22b. The interlacing may be carried out, for example, via a mechanical coupling, for example a tongue-and-groove arrangement, as shown in FIG. 11. Through the fact that leading holding means 22a and trailing holding means 22b are interlaced with one another, it is possible to reduce, and advantageously completely suppress, force peaks on the front or rear edge of the material to be treated 21 (viewed in the direction of transport). As a result of the interlacing 176, forces which are acting upon a holding means are also absorbed by an adjacent holding means. In particular, it is possible to carry out interlacing in such a way that forces are transmitted, transversely to the direction of transport 5, from one holding element 22a to the adjacent holding element 22b as a result of the interlacing. The interlacing 176 can come about as a result of suitable geometrical designing of the holding means 22a, 22b, for example by means of a fit with a small clearance of less than 1 mm or even in a force-locking manner. Even a form-locking connection in the manner of chain links which are connected to one another is possible in order to produce the interlacing.

Figure 5:
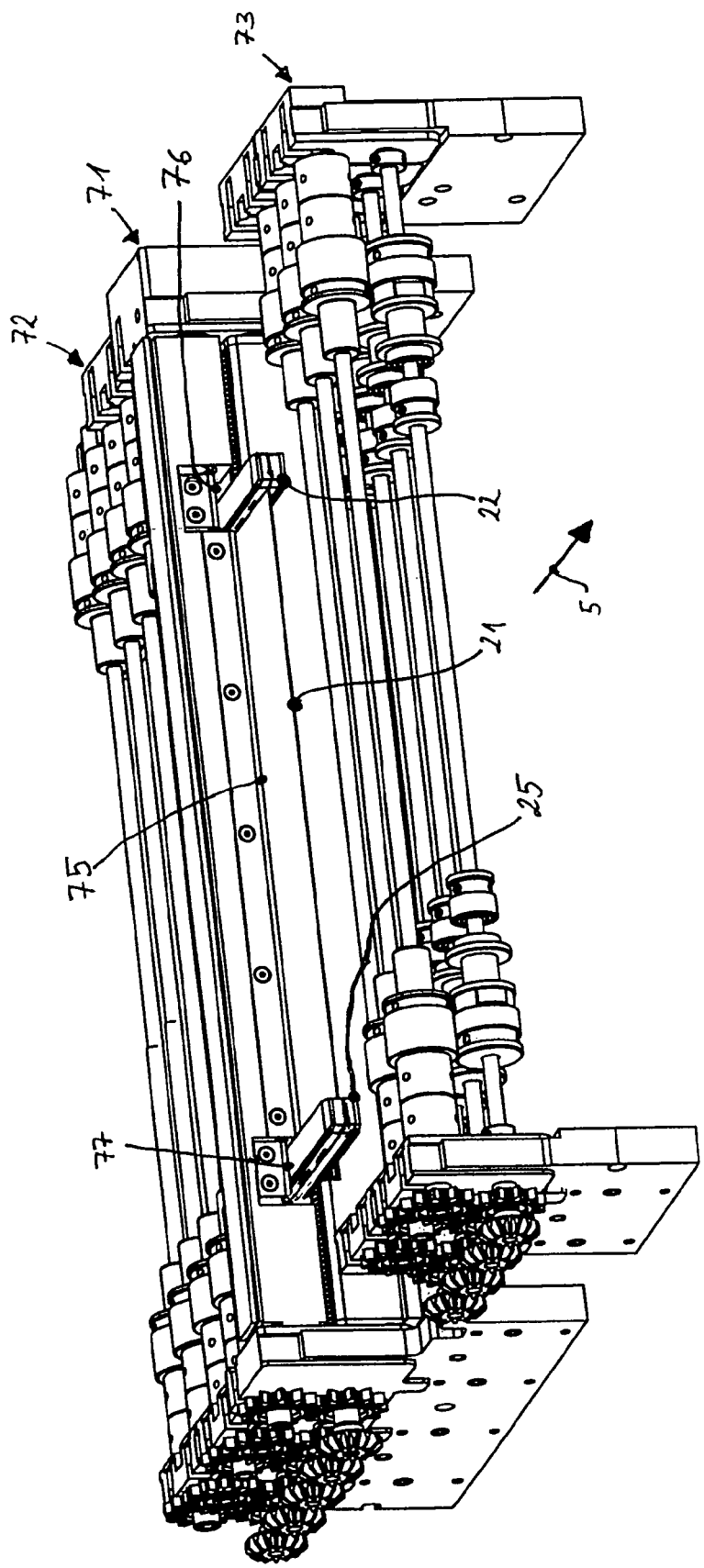
FIG. 5 is a perspective view of a treatment station belonging to an installation for treating the material to be treated, having a transporting device according to an embodiment.

FIG. 5 is a perspective view which shows a portion of a treatment installation, in which portion the material to be treated 21 is treated in a treatment station 71. The material to be treated 21, which is mounted by means of the holding means 22, 25, is fed to the treatment station 71 by a portion 72 of the transporting device of the treatment installation and is transported onwards from the treatment station 71 by a further portion 73 of the transporting device of said treatment installation. The portions 72, 73 of the transporting device may be constructed like the transporting device 41 described with reference to FIGS. 3 and 4. Said portions 72, 73 of the transporting device may be so arranged that the holding means 22, 25 are coupled, for each position of the material to be treated 21 which has been mounted, to at least one of the portions 72, 73 in such a way that the material to be treated 21 is safely transported onwards and, if necessary, tensioned transversely to the direction of transport.

The treatment station in question may be, for example, a station for the chemical treatment of the material to be treated 21, a station for rinsing said material or a station for drying said material or for blowing liquid off said material. Accordingly, a nozzle arrangement belonging to the treatment station 71 may feed a process chemical, water or a gas to the material to be treated 21, for example by exposing the latter to a flow.

The treatment station has an infeed region 75 by means of which a suitable treatment fluid, for example a process chemical, water or a gas, is fed to the central usable region of the material to be treated 21, which region is not masked by the holding means 22, 25. Said infeed region 75 may, for example, have a nozzle arrangement for exposing the usable region to a flow of the treatment fluid. The infeed region 75 is arranged in such a way that it reaches as far as the vicinity of the central usable region of the material to be treated, but does not touch said material. In particular, said infeed region 75 may be arranged in such a way that a portion thereof, which faces towards the material to be treated 21, protrudes inwards between the holding means 22, 25.

A further infeed region may be provided on the opposite side of the material to be treated 21 from the infeed region 75 (below the plane of transport in FIG. 5), so as to feed the treatment fluid to the opposite side of said material, for example by exposing it to a flow. The infeed regions provided on the opposite sides of the material to be treated 21 may be constructed in such a way that the material to be treated is acted upon from above and below in a symmetrical manner so as to keep low any deflection out of the plane of transport of said material to be treated 21. The infeed regions provided on the opposite sides of the material to be treated 21 may be constructed in such a way, and the component of force exerted upon said material in the widthwise direction chosen in such a way, that the upper side of said material is at a distance from the infeed region 75 which is substantially constant over the width of said material, and that the underside of the material to be treated is at a distance from a corresponding infeed region of the treatment station 71 for the underside of said material which is substantially constant over the width of said material. The infeed regions provided on the opposite sides of the material to be treated 21 may be constructed in such a way, and the component of force exerted upon said material in the widthwise direction chosen in such a way, that these distances are equal.

Clearances through which the holding means 22, 25 are transported when the material to be treated 21 is being transported through the treatment station 71 are provided on both sides of the infeed region 75. It is optionally possible to provide, alongside the infeed region 75, further infeed regions 76, 77 by means of which the treatment fluid is also fed to the holding means 22, 25, for example by exposing them to a flow of said fluid. The further infeed regions 76, 77 may be provided in a manner depending upon whether the holding means 22, 25 are likewise to be subjected to the treatment in the particular treatment station. For example, the further infeed regions 76, 77 may be provided in treatment stations in which the material to be treated is rinsed with water or dried by means of a flow of gas. The treatment station may, on the other hand, be constructed in such a way that no infeed regions 76, 77 are provided for the holding means, if a process chemical is being fed, by means of the treatment station, to the material to be treated 21, or to that usable region of the latter which is not masked by the holding means. It is thus possible, in treatment stations in which process chemicals are fed in, to avoid the holding means 22, 25 being directly sprayed with process chemicals, something which could lead to an increased occurrence of unwanted deposits.

If, as described above, the holding means 22, 25 are rinsed and dried together with the material to be treated, traces of a process chemical which have passed onto said holding means 22, 25 in a preceding treatment, with said chemical, of the usable region of the material to be treated, can be removed from the holding means 22, 25 in the rinsing and drying stations.

The treatment station may also be constructed in such a way that a selective treatment of the holding means 22, 25 takes place in regions in which said holding means 22, 25 are guided through said station, while the usable region of the material to be treated is not subjected to any direct treatment within the treatment station. In this way it is possible, for example, for process chemicals which have been left behind on the holding means 22, 25 to be removed in order to avoid carry-over. For removing liquid from the surface of the material to be treated 21, use may also be made of cylinders which are mounted in a floating manner, in particular mounted so as to be displaceable in the axial direction.

Whereas a description has been given, with reference to FIG. 5, of the transportation of the material to be treated, which is mounted by means of the holding means, through a treatment station in which a treatment fluid is fed in, treatment stations with a suitable design may also be constructed for other treatment steps. For example, the treatment station may be constructed so as to feed one or more of the following: a treatment fluid, electric current, energy, a pulse or radiation, to the material to be treated. Said treatment station may be constructed in such a way that that usable region of said material which is to be treated, which region is not masked by the holding means 22, 25, does not come into contact with fixed parts of the treatment station or transporting device.

As can be seen from the design, which has been explained with reference to FIG. 5, of the treatment station 71, the arrangement of the holding means 22, 25 at the edge regions of the material to be treated 21 which extend parallel to the direction of transport makes it possible for the infeed region 75 for the treatment fluid of said treatment station 71 to be designed in such a way that it is able to reach close to that usable region of the material to be treated which is not masked by the holding means 22, 25. In particular, the distance of the infeed region 75 from the material to be treated 21 is not limited by the dimensions of the holding means 22, 25.

Holding means according to an embodiment will be described with reference to FIGS. 6 and 7. Said holding means can be used for holding the material to be treated 21 and are designed so as to cooperate with the transporting device of the treatment installation explained with reference to FIGS. 3 to 5, for the purpose of transporting said material to be treated 21.

Figure 6:
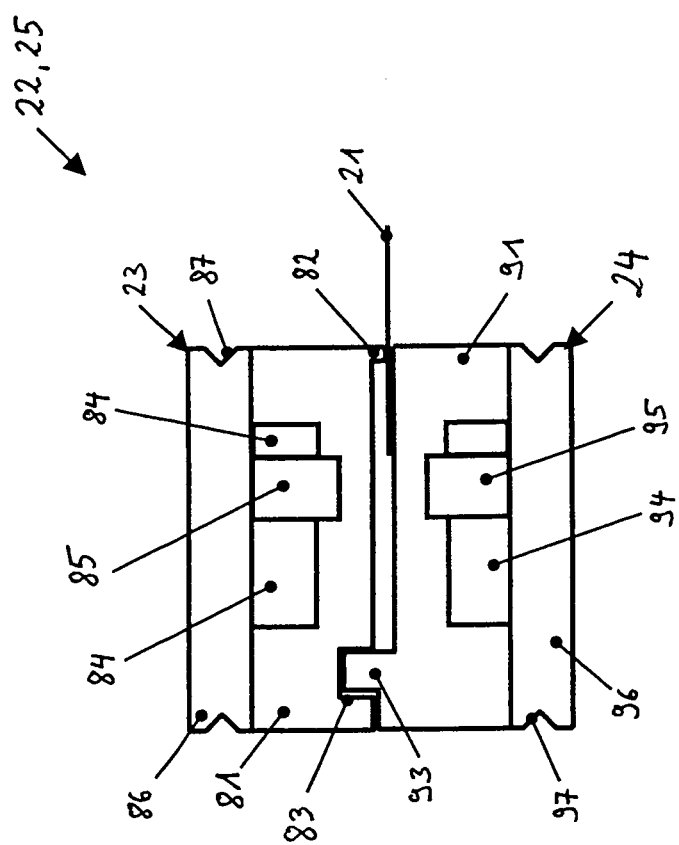
FIG. 6 is a cross-sectional view of holding means according to an embodiment.

FIG. 6 shows a cross-sectional view through the holding means 22, 25 at a position which is represented diagrammatically in FIGS. 2 and 7 by means of the line VI-VI. FIG. 7A is a plan view of the first holding part 23 of the holding means, and FIG. 7B is a plan view of the second holding part 24 of said holding means. The plan view of the first holding part 23 in FIG. 7A shows that side of said first holding part 23 which faces towards the second holding part 24 when the holding means are in the closed condition. The plan view of the second holding part 24 in FIG. 7B shows that side of the second holding part 24 which faces towards the first holding part 23 when the holding means are in the closed condition. The edge, which is represented at the bottom in FIGS. 7A and 7B, of the first and second holding parts corresponds to that side of the holding means which is represented on the left in FIG. 6 and faces away from the material to be treated.

The holding means 22 and 25 respectively comprise the two separate rail-shaped holding parts 23, 24 which are attached to opposite sides of the material to be treated 21, when the holding means 22 are in the closed state represented in FIG. 6, and which hold said material to be treated 21 between them in a force-locking manner. In an open condition, the holding parts 23, 24 are separated from one another so that the material to be treated 21 can be inserted between said holding parts 23, 24 or taken out of the holding means 22.

The first holding part 23 comprises a body 81 on which a contact edge 82 for holding the material to be treated 21 is constructed. Said body 81 has a groove 83 which acts, together with a complementary design of the second holding part 24, as a positioning means so as to position the holding parts 23, 24 relative to one another when in the closed condition.

The body 81 of the first holding part 23 has a stiffening core 84 made of a material having high stiffness, for example a metal. A magnet 85 is arranged in said body 81. The magnet 85 may be parallelepipedal. The core 84 may be constructed from a ferromagnetic metal in order to increase the magnetic force of attraction between the first and second holding parts.

The first holding part 23 also comprises a further body 86. Said further body 86 is attached to the body 81 in such a way that the stiffening core 84 and the magnet 85 are completely surrounded by the two bodies 81, 86. An outer surface of the further body 86 has a profile 87. It is possible, for example, for engaging means belonging to a loading or unloading apparatus to engage in the profile 87 so as to transfer the holding means between the closed condition and the open condition.

The bodies 81, 86 may be constructed from a plastic, in particular from a plastic which is inert in relation to the chemicals used in the treatment installation. In this case, the stiffening core 84 and the magnet 85 are completely encased with plastic. In a further embodiment, the bodies 81, 86 may be constructed in an integral manner as a single plastic body. The bodies 81, 86 may also be manufactured from a non-conductive material, for example from ceramics, or from a high-quality steel.

The second holding part 24 comprises a body 91 on which a projection 93 is constructed. Said projection 93 is constructed in such a way that it can be inserted in the groove 83 in the first holding part 23 and acts, together with the latter, as a positioning means so as to position the holding parts 23, 24 relative to one another when in the closed position.

The body 91 of the second holding part 24 has a stiffening core 94 made of a material having high stiffness, for example a metal. A magnet 95 is arranged in the body 91. The core 94 may be constructed from a ferromagnetic metal in order to increase the magnetic force of attraction between the first and second holding parts. The magnet 95 is arranged in such a way that an attractive force exists between the magnets 85, 95 when the holding means 22 are in the closed condition represented in FIG. 6.

The second holding part 24 also comprises a further body 96. Said further body 96 is attached to the body 91 in such a way that the stiffening core 94 and the magnet 95 are completely surrounded by the two bodies 91, 96. An outer surface of the further body 96 has a profile 97. It is possible, for example, for engaging means belonging to a loading or unloading apparatus to engage in the profile 97 so as to transfer the holding means between the closed condition and the open condition.

The bodies 91, 96 of the second holding part 24 may be constructed from a plastic, in particular from a plastic which is inert in relation to the chemicals used in the treatment installation. In this case, the stiffening core 94 and the magnet 95 are completely encased with plastic. In a further embodiment, the bodies 91, 96 may be constructed in an integral manner as a single plastic body. The bodies 91, 96 may also be manufactured from a non-conductive material, for example from ceramics, or from a high-quality steel.

The first holding part 23 and the second holding part 24 may be coated with a material which is chosen in such a way that wetting of the holding parts 23, 24 with at least one of the treatment fluids used in the installation for treating the material to be treated is reduced. In particular, the coating may be chosen in such a way that carry-over of process chemicals is reduced or suppressed.

As can be seen in the plan view from FIG. 7A, the first holding part 23 may be segmented in such a way that the structure, which is represented in the cross-sectional view from FIG. 6, of said first holding part 23 is interrupted by clearances 88 in a central region of said part. Said clearances 88 extend through the first holding part 23 in a direction which corresponds to the widthwise direction of the material to be treated 21, when the holding means 22 are holding said material. The clearances 88 interrupt the contact edge 82 so that the portions of the latter hold the material to be treated at a large number of separate linear portions.

As can be seen in the plan view from FIG. 7B, the second holding part 24 may be segmented in such a way that the structure, which is represented in the cross-sectional view from FIG. 6, of said second holding part 24 is interrupted by clearances 98 in a central region of said part. Said clearances 98 extend through the second holding part 24 in a direction which corresponds to the widthwise direction of the material to be treated 21, when the holding means 22 are holding said material. The clearances 98 interrupt the projection 93. Said clearances 98 are provided at positions along the longitudinal direction of the second holding part 24 which correspond to the positions of the clearances 88 on the first holding part 23. When the holding means 22 are in the closed condition, the clearances 88 in the first holding part 23 are thus aligned with the clearances 98 in the second holding part 24. Said clearances 88, 98 define passages through the holding means 22 which extend transversely through said holding means 22 when the latter are in the closed condition, i.e. in the widthwise direction of the material to be treated 21. Passages of this kind permit the transporting-away of liquid from the material to be treated through the holding means 22. It may be advantageous for the contact edge 82 to protrude by less than 1 mm in relation to the clearance 88. It is accordingly possible, when the holding means 22 are attached to the material to be treated 21, for a gap between the upper side of said material and the clearance 88 to have a height of less than 1 mm, said height being measured perpendicularly to the plane of transport. It may also be advantageous for the projection 93 to protrude by less than 1 mm in relation to the clearance 98. It is accordingly possible, when the holding means 22 are attached to the material to be treated 21, for a gap between the underside of said material and the clearance 98 to have a height of less than 1 mm.

As can likewise be seen in the plan views from FIGS. 7A and 7B, no clearances 88 or 98 are provided at end regions 101, 102 of the first holding part 23 or at end regions 103, 104 of the second holding part 24. Accordingly, a greater number of magnets 85 and 95, per unit of length, may be provided in the first and second holding parts 23, 24 respectively, in the end regions 101, 102, 103, 104. The holding force with which the first and second holding parts 23, 24 are held together in the end regions when the holding means 22 are in the closed condition is thereby increased. An increase of this kind in the holding force leads to particularly secure mounting of the edge regions of the material to be treated 21 which are held between the end regions 101, 103 and 102, 104, respectively. The holding parts 23, 24 may be constructed in such a way that the corners of the material to be treated are held between said end regions 101, 103 and 102, 104, respectively. It is thus possible to reduce or prevent working-free of the corners of the material to be treated from the holding means 22 when said material is being transported.

In the case of holding means according to a further embodiment, the construction represented in the cross-sectional view from FIG. 6 may extend continuously over the length of the first and second holding parts, i.e. said first and second holding parts may also be constructed in such a way that they do not form any passages for liquid to pass through. In this case, the contact edge 82 extends continuously along the longitudinal direction of the material to be treated 21 and holds the edge portion of said material at a large number of points, which are arranged on a continuous line.

In the case of holding means according to a further embodiment, the positioning means which determine the arrangement of the upper and lower holding parts when the holding means are in the closed condition may also be constructed in a different manner than by means of a groove-and-tongue arrangement. For example, the upper holding part and lower holding part may be connected to one another by means of a hinge. Under these circumstances, said upper and lower holding parts may have a design which is mirror-symmetrical with one another, relative to the plane of transport. A holding part of this kind may be employed for mounting the material to be treated at each of the two longitudinal edges.

Figure 8:
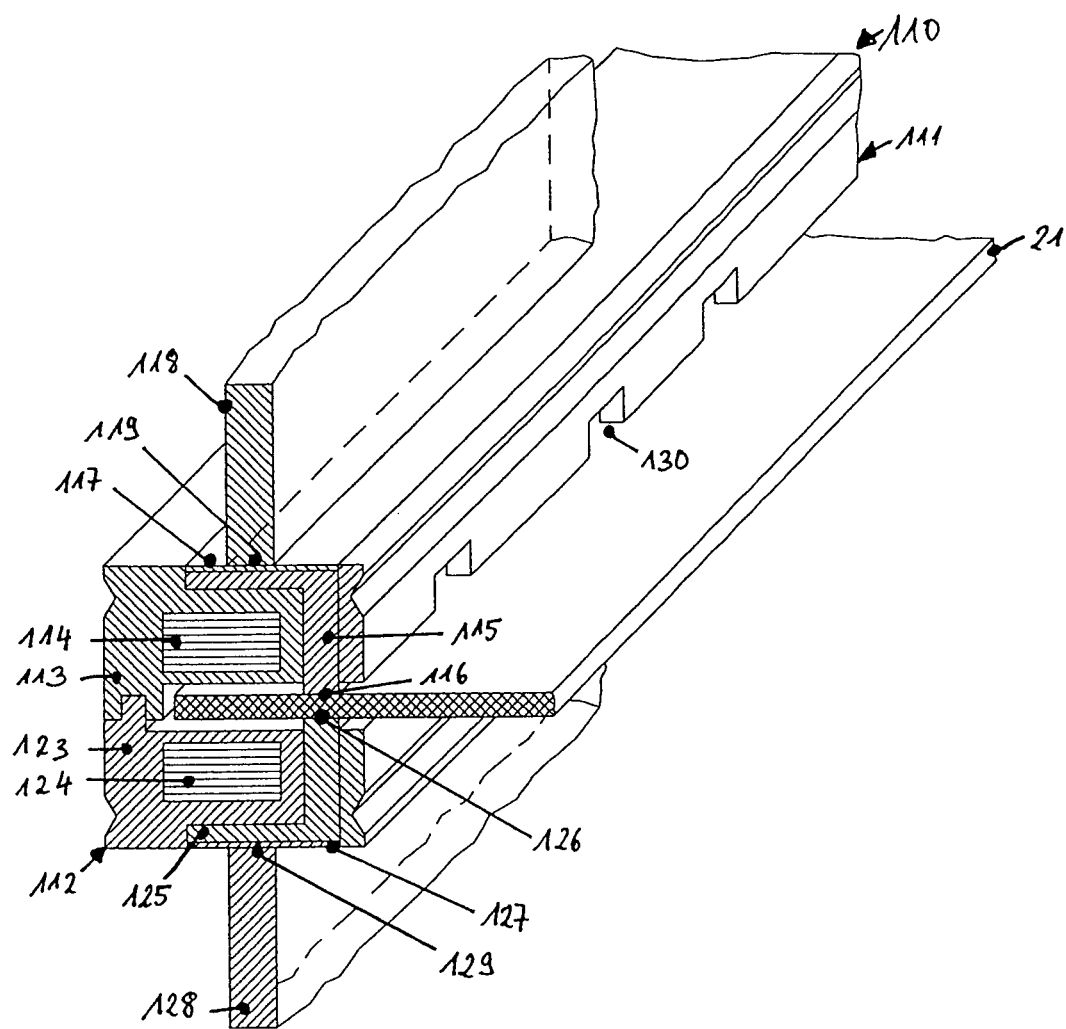
FIG. 8 is a diagrammatic, partially cut-away view of holding means according to a further embodiment.

FIG. 8 is a perspective view of holding means 110 according to a further embodiment. Said holding means 110 may be used for holding the material to be treated 21. They are set up in such a way that they not only hold said material mechanically, but can also be employed for making electrical contact with it. The holding means 110 can be used for making electrical contact with conductor foils, but also with thicker sheets in an electrolytic treatment plant or in a plating plant.

The holding means 110 comprise two separate, rail-shaped holding parts 111, 112 which, when the holding means 110 are in the closed condition represented in FIG. 8, are attached to opposite sides of the material to be treated 21 and hold the latter between them in a force-locking manner. In an open condition, the holding parts 111, 112 are separated from one another so that the material to be treated 21 can be inserted between said holding parts 111, 112 or taken out of the holding means 110.

The first holding part 111 comprises a body 113 which may be constructed from a plastic, in particular a plastic which is inert in relation to the process chemicals used in the treatment installation. The body 113 may also comprise a non-conductive material, for example ceramics or high-quality steel. A magnet 114 is embedded in the body 113. The second holding part 112 comprises a body 123 which may be constructed from a plastic, in particular a plastic which is inert in relation to the process chemicals used in the treatment installation. The body 123 may also comprise a non-conductive material, for example ceramics or high-quality steel. A magnet 124 is embedded in the body 123. The magnets 114, 124 are arranged in such a way that an attractive force exists between them when the holding means 110 are in the closed condition represented in FIG. 8.

The first holding part 111 has a groove which cooperates with a corresponding projection on the second holding part 112, so as to determine the relative positioning of the holding parts 111, 112 when the holding means 110 are in the closed condition. The side faces of the first holding part 111 and of the second holding part 112 are profiled, so as to permit a form-locking engagement, for example for the purpose of transferring the holding means from the closed condition into the open condition. Passages 130, which extend transversely through the holding means 110 so as to permit the transporting-away of liquid from the material to be treated 21 through said holding means 110, may be constructed in the holding means 111. Since these design features correspond to design features of the holding means 22 described with reference to FIGS. 6 and 7, additional reference may be made to the description of said figures.

Arranged in the body 113 of the first holding part 111 is an electrically conductive material 115 which, in the case of the holding part 111 represented, has a rectangular design. Said electrically conductive material 115 may, for example, be a metal. A portion of the electrically conductive material 115 protrudes out of the body 113 in such a way that, when the holding means 110 are in the closed condition represented in FIG. 8, it touches the material to be treated 21 with a contact face 116 constructed at its end. Said contact face 116 may serve both for mechanically holding the material to be treated 21 and also for making electrical contact with said material. The contact face 116 may be provided with a coating which may be constructed from a different material from the electrically conductive material 115, for example from a high-quality metal, a mixed oxide or a conductive elastomer.

A further electrically conductive contact face 117, which is connected in an electrically conductive manner to the electrically conductive material 115, is provided on an outer face of the holding part 111, which outer face is exposed towards the outside (on that face of the first holding part 111 which is the upper face in FIG. 8) when the holding means 110 are in the closed condition represented in FIG. 8. Said further electrical contact face 117 may be constructed from a different material from the electrically conductive material 115, for example from a high-quality metal, a mixed oxide or a conductive elastomer. The material for the further electrical contact face may, in particular, be chosen in such a way that a low-resistance contact exists between the further electrical contact face 117 and the contact element 118 by means of which current is fed in within the treatment installation. Said further electrical contact face 117 may be constructed in such a way that it is wider, transversely to the longitudinal direction of the first holding part 111, i.e. in the widthwise direction of the material to be treated 21, than the contact face 119 of the contact element 118 which is pressed, within the treatment installation, onto the further electrical contact face 117 for the purpose of feeding current thereto.

The first holding part 111 may be constructed in such a way that the contact face 116 and the further contact face 117 are of flat design. In a further embodiment, the contact face 116 and/or the further contact face 117 may have a convex shape. In particular, the contact face 116 and the further contact face 117 may be constructed with a convex shape in such a way that the material to be treated 21, or the contact face 119 of the contact element 118, touch over a smaller area, but with a greater normal force, than contact faces of planar construction.

Arranged in the body 123 of the second holding part 112 is an electrically conductive material 125 which, in the case of the holding part 112 represented, has a rectangular design. Said electrically conductive material 125 may, in particular, be a metal. A portion of the electrically conductive material 125 protrudes out of the body 123 in such a way that, when the holding means 110 are in the closed condition represented in FIG. 8, it touches the material to be treated 21 with a contact face 126 constructed at its end. Said contact face 126 may serve both for mechanically holding the material to be treated 21 and also for making electrical contact with said material. The contact face 126 may be provided with a coating which may be constructed from a different material from the electrically conductive material 125, for example from a high-quality metal, a mixed oxide or a conductive elastomer.

A further electrically conductive contact face 127, which is connected in an electrically conductive manner to the electrically conductive material 125, is provided on an outer face of the holding part 112, which outer face is exposed towards the outside (on that face of the second holding part 112 which is the lower face in FIG. 8) when the holding means 110 are in the closed condition represented in FIG. 8. Said further electrical contact face 127 may be constructed from a different material from the electrically conductive material 125, for example from a high-quality metal, a mixed oxide or a conductive elastomer. The material for the further electrical contact face 127 may, in particular, be chosen in such a way that a low-resistance contact exists between the further electrical contact face 127 and the contact element 128, by means of which face current is fed in within the treatment installation. Said further electrical contact face 127 may be constructed in such a way that it is wider, transversely to the longitudinal direction of the second holding part 112, i.e. in the widthwise direction of the material to be treated 21, than the contact face 129 of the contact element 128, which face is pressed, within the treatment installation, onto the further electrical contact face 127 for the purpose of feeding in current.

The second holding part 112 may be constructed in such a way that the contact face 126 and the further contact face 127 are of flat design. In a further embodiment, the contact face 126 and/or the further contact face 127 may each have a convex shape. In particular, the contact face 126 and the further contact face 127 may be constructed with a convex shape in such a way that the material to be treated 21, or the contact face 129 of the contact element 128, touch over a smaller area, but with a greater normal force, than contact faces of planar construction.

The electrically conductive material 115 in the first holding part 111 and the electrically conductive material 125 in the second holding part 112 may be interrupted along the longitudinal direction of the holding means 110. Said first and second holding parts 111, 112 may thus have a number of segments of electrically conductive material, 115 and 125 respectively, along their longitudinal directions. Alternatively, the electrically conductive material 115 and/or 125 may also be provided in a pin-shaped manner in the first and/or second holding part 111, 112. In a further modification, that portion of the electrically conductive material 115, 125 which protrudes from the first holding part 111 or the second holding part 112 in the direction of the material to be treated 21 may be constructed in a segmented manner or in the form of a number of pins. Contact faces constructed in this way can be successfully brought into full contact with the material to be treated 21. The segments or pins may be provided in a manner spaced apart from one another or arranged close beside one another in a row.

The material to be treated 21 which has been mounted by means of the holding means 110 can be transported through a treatment installation in which the contact elements 118, 128 are pressed, within an electrochemical treatment station, against the contact faces 117, 127 which are exposed towards the outside. The contact elements may be conventional contact elements, for example in the form of clips. Said contact elements may also be of roller-shaped or disc-shaped construction. The contact elements 118, 128 may, in particular, be pressed against the contact faces 117, 127 of the holding means 110 with forces which are equally large in terms of magnitude but are directed in opposite directions.

In a further embodiment, the holding means 110 may be constructed in such a way that, instead of a clearance and a projection which engages in the latter when the holding means 110 are in the closed condition, as represented in FIG. 8, a hinge is provided which connects the upper holding part 111 and the lower holding part 112 to one another and positions them relative to one another.

Even though holding means 22, 110 for flat material to be treated, such as have been described with reference to FIGS. 6 to 8, may be employed for transporting a thin material to be treated having low inherent stiffness, said holding means 22, 110 can also be employed for mounting, and/or making contact with, thicker substrates. For example, the holding means 110 according to the invention can also be employed for transporting printed circuit boards through a galvanising installation or the like, even if said printed circuit boards have such high inherent stiffness that they do not have to be tensioned in the widthwise direction.

Figure 9:
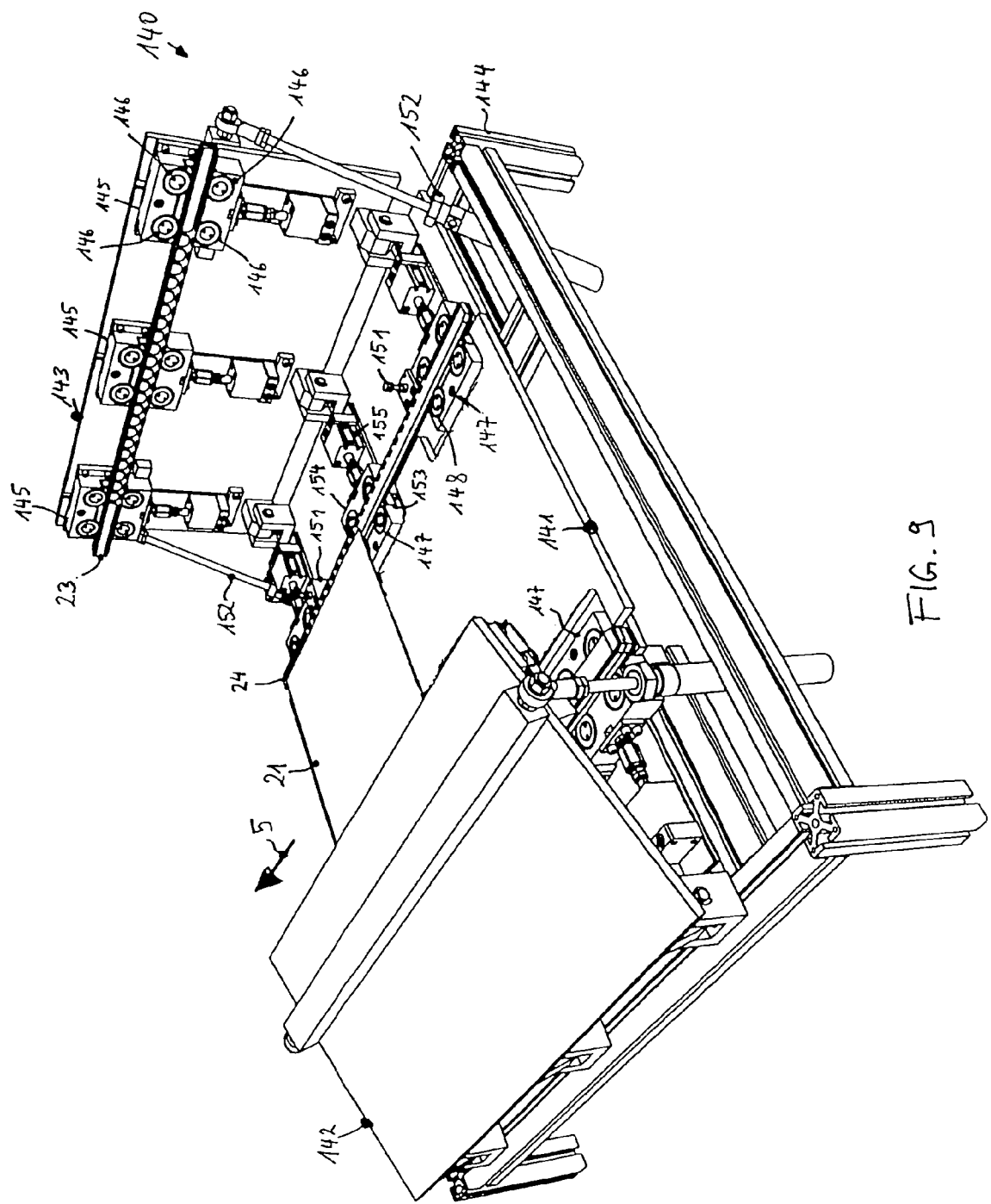
FIG. 9 is a perspective view of a loading apparatus according to an embodiment.

FIG. 9 is a perspective view of a loading apparatus 140 according to an embodiment. Said loading apparatus 140 may be used as the loading apparatus 10 belonging to the installation 1 from FIG. 1.

The loading apparatus 140 is designed so as to attach holding means 22 having first and second holding parts 23, 24 to a flat material to be treated 21. Said loading apparatus 140 comprises supporting means which may be constructed as a supporting plate 141. Said supporting plate 141 may be constructed as a perforated plate. The supporting plate 141 is vertically adjustable by means of an actuating apparatus (not represented). The loading apparatus 140 also comprises two flaps 142, 143 which are pivotably mounted on a frame 144. Pneumatic apparatuses 151, 152 are provided for the purpose of opening and closing the flaps.

A plurality of guiding apparatuses 147 are arranged on the frame 143 in two rows. Said guiding apparatuses 147 are designed so as to receive the second holding part 24 of the holding means 22 and to guide it when said holding means 22 are transported onwards. A plurality of guiding apparatuses 145 is arranged in a row in each case on each of the flaps 142, 143. The guiding apparatuses 147 are designed so as to receive the first holding part 23 of the holding means 22 and to guide it when said holding means 22 are transported onwards. The guiding apparatuses 147 and the guiding apparatuses 145 may, in particular, be arranged in such a way that, when the flaps 142, 143 are in the closed condition, one of the guiding apparatuses 145 lies vertically above one of the guiding apparatuses 145 in each case.

The loading apparatus 140 is designed so as to transfer the holding means 22 between their closed condition, in which the first and second holding parts 23, 24 are touching one another, and their open condition, in which the material to be treated 21 can be inserted in said holding means 22. For this purpose, the guiding apparatuses 147 may be designed so as to secure the second holding part 24, when the flaps 142, 143 are opened, on said guiding apparatuses 147 in such a way that it does not move in conjunction with the first holding part 23. The guiding apparatuses 145 may be designed so as to secure the first holding part 23, when the flaps 142, 143 are opened, on said guiding apparatuses 145 in such a way that it moves away from the second holding part 24 in conjunction with the flap 142 or 143.

If the first and second holding parts have a profiled outer surface, each of the guiding apparatuses 147 may have engaging means 148 which hold the second holding part 24 in a form-locking manner when the flap 142, 143 is opened. Said engaging means may comprise, for example, a disc 148 or a number of discs 148 having an outer edge whose profile, for example in the form of a V-shaped projection, is complementary to a lateral profile of the second holding part 24. In particular, each of the guiding apparatuses 147 may have at least two discs 148 with an outer profile which is complementary to the outer profile of the second holding part 24, the said two discs 148 coming into engagement with opposed outer faces of the said second holding part 24. Similarly, each of the guiding apparatuses 145 may have engaging means 146 which hold the first holding part 23 in a form-locking manner. Said engaging means may comprise, for example, a disc 146 or a number of discs 146 having an outer edge whose profile, for example in the form of a V-shaped projection, is complementary to a lateral profile of the first holding part 23. In particular, each of the guiding apparatuses 145 may have at least two discs 146 with an outer profile which is complementary to the outer profile of the first holding part 23, the said two discs 146 coming into engagement with opposed outer faces of the said first holding part 23.

The operation of the loading apparatus 140 will be described next. At the beginning of a work cycle, the flaps 142, 143 are closed and no holding parts 23, 24 are located in the guiding apparatuses 145, 147. The holding means 22 are introduced, in the closed condition, into the guides defined by the guiding apparatuses 145, 147. When the holding means 22 are completely introduced into the guides defined by the guiding apparatuses 145, 147, the pneumatic apparatuses 151, 152 are actuated in order to open the flaps 142, 143. In the process, the engaging means 148 hold the second holding part 24 on the guiding apparatuses 147 and the engaging means 146 hold the first holding part 23 on the guiding apparatuses 145. When the flaps are opened, the holding means 22 are correspondingly transferred into the open condition.

The flaps 142, 143 are opened sufficiently far for it to be possible for the material to be treated 21 to be deposited, by means of a robot or the like, between the two second holding parts 24 held by the guiding apparatuses 147. Before the material to be treated 21 is deposited, the supporting plate 141 is moved vertically into a position in which it is able to support said material deposited on the second holding part 24. In the process, the surface of the supporting plate may be arranged in such a way that it is located in one plane with the receiving regions of the second holding parts 24 on which the material to be treated 21 is deposited.

As a result of renewed actuation of the pneumatic apparatuses 151, 152, the flaps 142, 143 are closed so as to bring the first holding parts 23, which are held on said flaps 142, 143, into contact with the second holding parts 24 again. Thus the holding means are transferred into the closed condition, under which circumstances the material to be treated 21 is held, at its edge regions which extend in the longitudinal direction, between the first and second holding parts 23, 24.

After the holding means 22 have been transferred into the closed condition, the supporting plate 141 is lowered. The material to be treated, which is held by said holding means 22, is transported out of the loading apparatus 140. This can take place, for example, by driving the disc-shaped engaging means 148 on the guiding apparatuses 147 in a rotating manner and/or by driving the disc-shaped engaging means 146 on the guiding apparatuses 145 in a rotating manner.

In an embodiment, disc-shaped engaging means belonging to at least one guiding apparatus 145 or 147 which guides the holding means attached to one longitudinal edge of the material to be treated, and disc-shaped engaging means belonging to at least one further guiding apparatus 145 or 147 which guides the further holding means attached to the other longitudinal edge of the material to be treated, are driven in a rotating manner for the purpose of transporting said holding means. In an embodiment, there are driven in a rotating manner, on each side of the material to be treated, disc-shaped engaging means belonging to at least one guiding apparatus 145 or 147 which is arranged at the outermost position in the direction of transport, i.e. adjacent to the cushioning apparatus 12 when use is made of the loading apparatus 140 in the installation 1 from FIG. 1. In a further embodiment, disc-shaped engaging means belonging to all the guiding apparatuses 147 are driven in a rotating manner so as to transport the holding means and thus the material to be treated which is mounted on them. In each case, all the disc-shaped engaging means belonging to the corresponding guiding apparatuses may be driven for the purpose of transporting the holding means. In an embodiment, only some of the disc-shaped engaging means are driven in each of the guiding apparatuses, for example those disc-shaped engaging means which rest against the holding means on the outside, i.e. are provided on that side of the guiding apparatuses 147 which faces away from the material to be treated.

In order to guide the holding means 22 in a secure manner, the guiding apparatuses 147 and 145 may have two cheeks, 153 and 154 respectively, which are displaceable towards one another. A depression, into which at least one portion of the second or first holding part can be inserted, is provided between the cheeks 153 and 154 respectively. A moving apparatus 155 is coupled to at least one of the cheeks 153 and 154 so as to adjust said cheeks relative to one another. The moving apparatus 155 may be constructed, for example, as a pneumatic apparatus which is coupled to the inner cheek 153. Said moving apparatus is capable of adjusting the cheeks 153, 154 relative to one another in such a way that the disc-shaped engaging means, 148 and 146 respectively, attached to the cheeks are pressed against that holding part of the holding means which is guided in the guiding apparatus. If the disc-shaped engaging means in the corresponding guiding apparatus are driven in a rotating manner so as to transport the holding means in the direction of transport, the moving apparatus 155 may be set up so as to adjust the cheeks 153, 154 in such a way that, when the disc-shaped engaging means are driven in a rotating manner, the holding means 22 are moved as a result of a friction-locking connection between the engaging means belonging to the guiding apparatus and said holding means 22. Alternatively or in addition, a form-locking connection between the disc-shaped engaging means belonging to the guiding apparatuses and the holding means may also be provided in such a way that said holding means are moved when the disc-shaped engaging means are rotated.

Whereas, in the embodiment represented in FIG. 9, the guiding apparatuses are used both for guiding the holding means in the direction of transport and also for securing the holding parts of the holding means when the flaps are opened in order to separate said holding parts from one another, separate apparatuses may be provided for these functions. For example, pin-shaped engaging means may be provided in order to secure the holding parts of the holding means in such a way, when the flaps are opened, that said holding parts are separated from one another while the guiding apparatuses guide the holding means during transportation in the direction of transport.

The pneumatic apparatuses 151, 152 open the flaps 142, 143 and thus act as moving means which bring about a movement of the engaging means 146, which are in engagement with the first holding part 23, relative to the engaging means 148 which are in engagement with the second holding part 24. The pneumatic apparatuses 151, 152 may be so constructed and actuated that the force exerted, or the torque acting upon the flaps 142, 143, decreases, in each case, as the angle of opening of said flaps 142, 143 increases. For example, pneumatic pressure rams 151 may be provided, which are capable of exerting a first force over a first path in order to produce initial opening of the flap 143 and, in the process, detach the holding parts 23, 24 of the holding means 22 from one another. The ongoing opening of the flap 143 may take place by means of further pneumatic apparatuses 152 or other actuators which can be actuated over a longer path than the pressure rams 151, but only exert a smaller force.

Modifications to the loading apparatus 140 described with reference to FIG. 9 may be carried out in further embodiments. For example, the engaging means which hold the first and second holding parts, 23, 23 respectively, of the holding means 22, may be designed in such a way that they hold said and second holding parts in a force-locking manner in order to transfer said holding means from the closed condition into the open condition. For example, use may also be made, instead of the vertically adjustable supporting plate 141, of an apparatus which generates an air cushion for the purpose of supporting the material to be treated 21, for example when the holding means are in the open condition. The holding means 22 may also be offset, before reaching the closed condition, into a condition in which they are provided with a bending stress parallel to the plane of transport.

The apparatus which has been explained with reference to FIG. 9 may be used, not only as a loading apparatus, but also as an unloading apparatus. In that case, the functioning sequences described above are reversed in such a way that the material to be treated which is held by the holding means is fed to the apparatus, and said holding means are transferred from the closed condition into the open condition in order to be able to remove the material to be treated from the holding means. An unloading apparatus of this kind may be employed as the unloader 13 in the installation 1 from FIG. 1.

Figure 10:
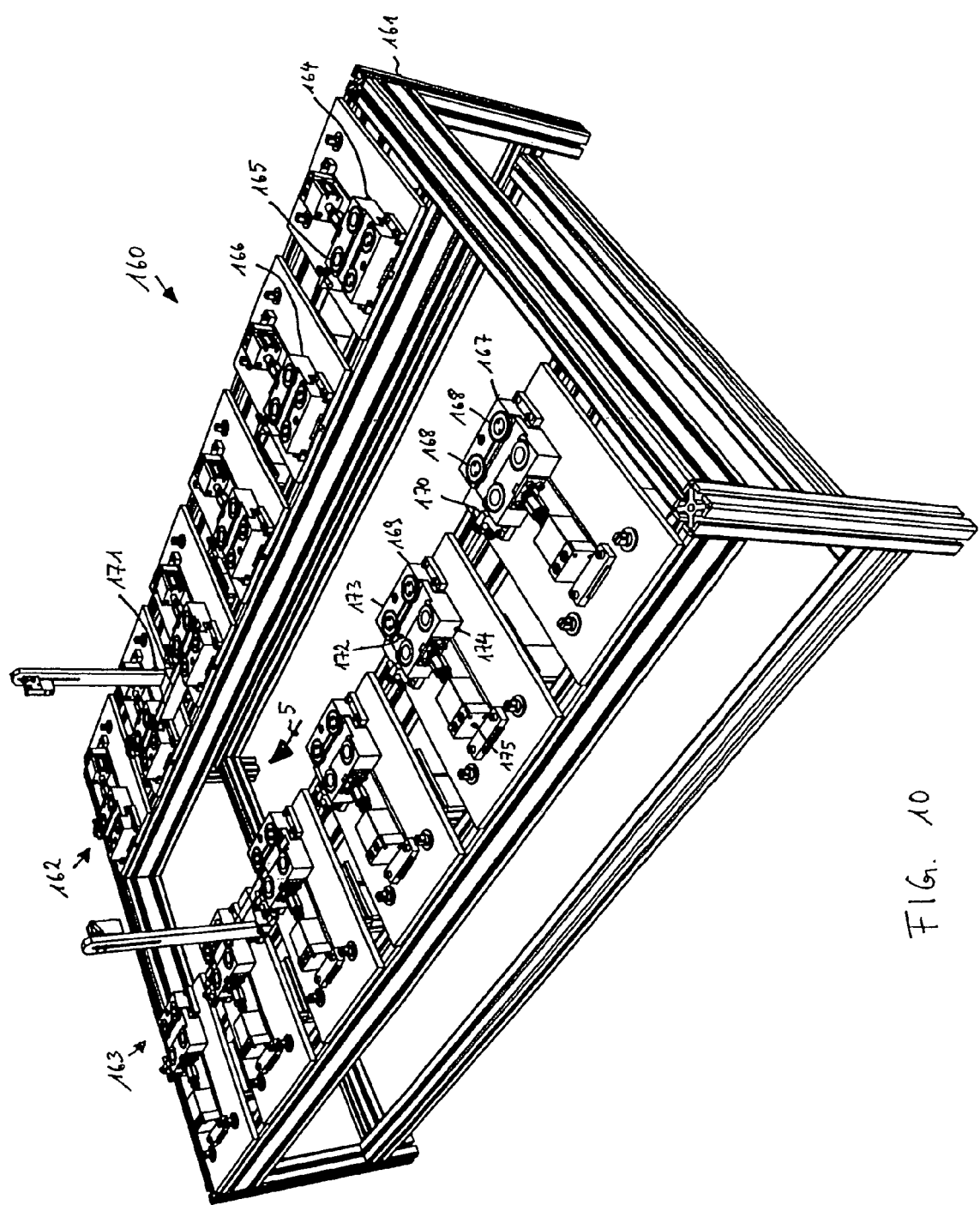
FIG. 10 is a perspective view of a cushioning apparatus belonging to the installation represented in FIG. 1.

FIG. 10 is a perspective view of a cushioning apparatus 160, which can be used as the cushioning apparatus 12 or as the cushioning apparatus 14 in the treatment installation from FIG. 1.

Said cushioning apparatus may be set up so as to fulfil additional tasks besides receiving material to be treated which has been delivered from the loading apparatus or is to be fed into the unloading apparatus. As will be explained next in the case of the cushioning apparatus 160, said cushioning apparatus is capable of tensioning the material to be treated, which is held by holding means along the longitudinal edges, in the direction transverse to the direction of transport, while it transports said material to be treated from the loading apparatus to the process line. Alternatively or in addition, the cushioning apparatus may be set up so as to set a distance between consecutive substrates or materials to be treated.

Said cushioning apparatus may also be set up so as to set a synchronism between the holding means attached to opposed longitudinal edges of the material to be treated, in such a way that said holding means are arranged at identical positions along the direction of transport, i.e. are in synchronism.

The cushioning apparatus 160 has a first group 162 of transporting devices and a second group 163 of transporting devices, which are attached to a frame 161. Each of the transporting devices in the first and second groups 162, 163 of transporting devices is set up so as to guide, and move onwards, the holding means 22 which are holding the material to be treated 21. For that purpose, each of the transporting devices has a corresponding guide groove for receiving the holding means 22. Rotatably mounted driving discs 165, 168 are provided along the guide grooves in the transporting devices. Said driving discs may be arranged in pairs on opposite sides of the guide grooves. The holding means are moved in the direction of transport as a result of the driving discs being driven in a rotating manner. For example, at least one driving disc in each of the transporting devices may be driven in a rotating manner in order to move the holding means. In one embodiment, a pair of driving discs in each transporting device, which discs rest against the holding means on the outside of the latter, i.e. on that side of the transporting device which faces away from the material to be treated, is driven. The material to be treated which is held by the holding means is transported onwards as a result of the movement of said holding means. Even in the cushioning apparatus 160, the transporting of the material to be treated thus takes place through the fact that the transporting devices 164, 166, 167, 169 move the holding means on which said material to be treated is mounted.

Each of the transporting devices may have two cheeks 173 and 174, which can be displaced towards one another and between which the guide groove 172 is constructed. A moving apparatus 175 is coupled to at least one of the cheeks 173 or 174 in order to adjust said cheeks relative to one another. A pair of driving discs may be provided on each of the cheeks. The moving apparatus 175 may be constructed, for example, as a pneumatic apparatus which is coupled to the inner cheek 173. Said moving apparatus is capable of adjusting the cheeks 173, 174, relative to one another, in such a way that the driving discs attached to said cheeks are pressed against that holding part of the holding means which is arranged in the guide groove. The moving apparatus 175 may be set up so as to adjust the cheeks 173, 174 in such a way that, when the driving discs are driven in a rotating manner, the holding means 22 are moved as a result of a friction-locking connection between said driving discs and said holding means 22. Alternatively or in addition, a form-locking connection between the driving discs and the holding means 22 may also be provided in such a way that said holding means 22 are moved when the driving discs are rotated.

The transporting devices belonging to the groups 161, 162 of transporting devices may be provided in such a way that, when the material to be treated which is held by the holding means is being transported, the distance between said holding means, which hold said material to be treated at its opposite longitudinal edges, is gradually increased. For that purpose, the transporting devices may be arranged in such a way that the distance between the guide grooves in the transporting devices 166, 168 is greater than the distance between the guide grooves in the transporting devices 164, 167. The distance between the guide grooves of transporting devices which are provided for the two holding means which are attached laterally to the material to be treated, may increase along the direction of transport. In this way, the material to be treated may be gradually tensioned within the cushioning apparatus 160 while it is being transported to the process line by the loading apparatus to the process line.

In order to monitor the movement of the holding means within the cushioning apparatus 160, sensors 170 which detect the passage of the holding means through the corresponding transporting devices are provided on said transporting devices. Further sensors 171 are provided for setting the distance between substrates. Said sensors 171 may, for example, detect an actual distance between holding means on consecutive substrates or materials to be treated. The holding means attached to consecutive substrates may be moved onwards, in dependence upon the actual distance detected, in such a way that a desired ideal distance is set.

The devices, methods and holding means according to various embodiments make it possible to transport material to be treated within an installation for the chemical and/or electrochemical treatment of said material in such a way that the safe transportation of material to be treated having low inherent stability or having a delicate surface is possible.

Numerous modifications to the embodiments which have been represented in the figures and described in a detailed manner can be carried out in other embodiments.

Whereas, in the transporting device described with reference to FIGS. 3 and 4, movable bearings press the holding means provided on the two sides of the material to be treated, resiliently outwards, it is possible, in one modification, to provide a movable bearing for the holding means attached to one longitudinal edge of the material to be treated, while a fixed bearing is provided for the holding means attached to the other longitudinal edge of said material to be treated. In further embodiments, the force acting upon the material to be treated, transversely to the direction of transport and within the plane of transport may be generated, not by mechanical bearings but, for example, by a flow of fluid flowing transversely to said direction of transport.

Whereas a transporting device having transporting rollers has been described in the context of an embodiment, other transporting means may also be used in other embodiments. For example, the transporting device may have a revolving chain. Engaging portions which permit hooking of the holding means into said revolving chain may be constructed on the holding means which hold the material to be treated at its longitudinal edge.

The component of force which acts upon the material to be treated, transversely to the direction of transport and within the plane of transport, does not have to be supplied by the transporting device. In further embodiments, there may be provided, for example, springy elements which are coupled to the two holding means acting upon the opposed longitudinal edges of the material to be treated and which press said holding means away from one another. The pair of holding means and the springy elements thus form a frame which stabilises the material to be treated at the longitudinal edge and tensions said material in the widthwise direction. The springy elements may extend, in the widthwise direction of the material to be treated, between the holding means acting upon the opposed longitudinal edges of said material. Said springy elements may be designed in such a way that they are relatively thin, for example have a thickness of less than 3 mm.

In yet a further embodiment, there may be provided springy elements which are coupled to the two holding means acting upon the opposed longitudinal edges of the material to be treated, and which press said holding means away from one another. The springy elements may be relatively thin, for example be constructed with a thickness of less than 3 mm.

Each of the holding means may be segmented into a number of portions which are spaced apart in the longitudinal direction of the material to be treated. There may be provided, between the portions of each of the holding means, further springy elements which press the portions of the corresponding holding means away from one another in the longitudinal direction of the material to be treated. The portions of the holding means having the springy elements and the further springy elements form a completely resilient frame which is able to tension the material to be treated, both in the longitudinal direction and in the widthwise direction.

Whereas holding means may be attached to both longitudinal edges of the material to be treated in order to hold the latter, in further embodiments, holding means which hold said material to be treated at at least two points along the longitudinal edge, may also be attached only to one of those edge regions of the material to be treated which extend parallel to the direction of transport.

Whereas embodiments have been described in the context of installations in which the material to be treated is moved within a horizontal plane of transport, the devices and methods can likewise be employed if the material to be treated is transported in a vertically directed manner.

The material to be treated may be immersed in a treatment liquid while it is being transported. The transporting devices and holding means according to the various embodiments may be employed in a suitable manner even in the case of immersed material to be treated.

The transportation of material to be treated which has low inherent stability is one field of application in which embodiments of the invention can be advantageously employed.

In addition, it is possible, in particular, for the holding means according to the invention to also be employed for transporting printed circuit boards or the like which have such high inherent stability that they are not tensioned transversely to the direction of transport during transportation. For example, holding means according to the invention, such as are indicated in claims 22 to 24 and have been described in greater detail with reference to the embodiment from FIG. 8, can be widely used for transporting substrates or other material to be treated, within an electrolysis installation or the like.

LIST OF REFERENCE SYMBOLS 1 treatment installation
2 process line
3, 4 treatment station
5 direction of transport
6, 7 component of force transverse to the direction of transport
8 material to be treated
9 holding means
10 loading apparatus
11 material to be treated held by holding means
12 cushioning apparatus
13 unloading apparatus
14 further cushioning apparatus
15 material to be treated which has been treated
16 holding means
21 material to be treated
22, 25 holding means
22a, 22b holding means
23, 26 first holding part
24, 27 second holding part
28, 29 bevelled surfaces
B width of material to be treated
BR width of edge region
L length of material to be treated
LH length of holding means
31 detail view
32, 33 contact edge
34, 35 passage for liquid
41 transporting device
42, 43 roller conveyor
44, 44' pressure-applying roller
45, 45' movable bearing (roller with groove)
46 gearwheels
47 bearing insert
48 clearance
51, 52 shaft
53 guide groove
54, 55 magnet
56 mounting for magnet
57 tensioning force
61 stop element
62 rotational entrainment means
63 weight
64 clutch
71 treatment station
72, 73 portion of transporting device
75 infeed region
76, 77 further infeed region
81 body
82 contact edge
83 groove
84 stiffening core
85 magnet
86 body
87 profile
91 body
93 projection
94 stiffening core
95 magnet
96 body
97 profile
101-104 end region of holding part
110 holding means
111, 112 holding part
113 body
114 magnet
115 electrically conductive material
116, 117 contact face
118 contact element
119 contact face
123 body
124 magnet
125 electrically conductive material
126, 127 contact face
128 contact element
129 contact face
130 passage
140 loading apparatus
141 supporting table
142, 143 flap
144 frame
145, 147 guiding apparatus
146, 148 engaging means
151, 152 pneumatic apparatuses
153, 154 cheek of the guiding apparatus
155 moving apparatus
160 cushioning apparatus
161 frame
162, 163 group of transporting apparatuses 164, 166,
167, 169 transporting apparatus
165, 168 driving discs
170, 171 sensor
172 guide groove
173, 174 cheek of transporting apparatus
175 moving apparatus
176 coupling

The invention claimed is:

1. Device for transporting a flat material to be treated, which is mounted along an edge region by means of holding means, for an installation for the chemical and/or electrochemical treatment of said material to be treated, wherein said device is set up so as to transport the material to be treated within a plane of transport in a direction of transport, said device comprising:
    transporting means coupled to the holding means in a detachable manner and which are configured to move said holding means, with the material to be treated mounted thereon, in the direction of transport; and
    tensioning means for exerting, upon the holding means, a force which is directed within the plane of transport and transversely to the direction of transport, the tensioning means comprising:
        a movable bearing to guide the holding means; and
        at least one magnet in order to exert a force on the movable bearing transversely to the direction of transport,
    wherein the device is configured to exert, at least during a portion of the transportation of the material to be treated, a force having a component which lies within the plane of transport and is directed transversely to the direction of transport, upon at least one region of the material to be treated.

2. Device according to claim 1, wherein the transporting means comprise a driving shaft to which the movable bearing is attached.

3. Device according to claim 1, wherein said device is configured to transport the material to be treated which is mounted along a further edge region by means of further holding means, wherein said device comprises further tensioning means which are configured to exert, upon said further holding means, a force which is directed within the plane of transport and transversely to the direction of transport.

4. A system for transporting a flat material to be treated for an installation for the chemical and/or electrochemical treatment of said material to be treated, said system comprising:
    holding means configured to be coupled to the edge region of the material to be treated, wherein the holding means comprise a holding rail in which passages for a liquid are formed; and
    a device to transport the material to be treated within a plane of transport in a direction of transport, said device comprising:
        a transport mechanism coupled to the holding means in a detachable manner, the transport mechanism configured to move said holding means, with the material to be treated mounted thereon, in the direction of transport; and
        tensioning means for exerting, upon the holding means, a force which is directed within the plane of transport and transversely to the direction of transport, the tensioning means comprising:
            a movable bearing to guide the holding means; and
            a bias mechanism to exert a force upon the movable bearing transversely to the direction of transport.

5. A system according to claim 4, further comprising:
    a loading or unloading apparatus for the installation for the chemical and/or electrochemical treatment of the material to be treated,
    wherein the loading or unloading apparatus is set up so as to transfer the holding means between a closed condition for holding the material to be treated and an open condition, and comprises a supporting apparatus for supporting said material to be treated when the holding means are transferred into the open condition.

6. A system according to claim 5, wherein the loading or unloading apparatus is configured to receive the holding means in the closed condition, transfer them from the closed condition into the open condition and then back into the closed condition, and to pass them out in the closed condition.

7. A system according to claim 4, wherein the holding means are detachably coupled to the transporting means.

8. A system according to claim 4, wherein the holding means extend along the direction of transport on the edge region of the material to be treated.

9. A system according to claim 4, wherein the holding means comprise a first holding part and a second holding part, the first and second holding parts having a closed condition for mounting the material to be treated and an open condition for insertion of the material to be treated.

10. A system according to claim 9, wherein the first and second holding parts are coupled to the material to be treated in a force-locking connection.

11. The device of claim 1, wherein the holding means comprise a holding rail in which passages for a liquid are formed.

* * * * *